(12) United States Patent
Bornstein et al.

(10) Patent No.: US 7,832,090 B1
(45) Date of Patent: Nov. 16, 2010

(54) METHOD OF MAKING A PLANAR ELECTRODE

(75) Inventors: Jonathan Bornstein, Cupertino, CA (US); David Hansen, Palo Alto, CA (US); Steven W. Longcor, Mountain View, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/660,424

(22) Filed: Feb. 25, 2010

(51) Int. Cl.
*H01R 43/00* (2006.01)

(52) U.S. Cl. .............................. 29/825; 29/830; 29/832; 29/846; 29/852

(58) Field of Classification Search .................. 29/825, 29/830, 832, 846, 852
See application file for complete search history.

(56) References Cited

U.S. PATENT DOCUMENTS

| | | | |
|---|---|---|---|
| 6,034,882 A | 3/2000 | Johnson et al. | |
| 6,062,952 A | 5/2000 | Robinson et al. | |
| 6,858,531 B1 * | 2/2005 | Zhu et al. | 438/633 |
| 6,903,361 B2 | 6/2005 | Gilton | |
| 6,930,909 B2 | 8/2005 | Moore et al. | |
| 6,972,238 B2 | 12/2005 | Hsu et al. | |
| 7,030,019 B2 | 4/2006 | Kawasaki | |
| 7,148,533 B2 | 12/2006 | Hsu et al. | |
| 7,285,145 B1 * | 10/2007 | Zhu et al. | 51/307 |
| 7,316,976 B2 | 1/2008 | Nojo et al. | |
| 7,335,906 B2 | 2/2008 | Toda | |
| 7,459,716 B2 | 12/2008 | Toda et al. | |
| 7,460,385 B2 | 12/2008 | Gruber et al. | |
| 7,569,459 B2 | 8/2009 | Karg et al. | |
| 7,577,022 B2 | 8/2009 | Muraoka et al. | |
| 2003/0015740 A1 | 1/2003 | Li et al. | |
| 2003/0151959 A1 | 8/2003 | Tringali et al. | |
| 2007/0176264 A1 | 8/2007 | Lee et al. | |
| 2008/0173975 A1 | 7/2008 | Chen et al. | |
| 2008/0254617 A1 | 10/2008 | Adetutu et al. | |
| 2009/0047787 A1 | 2/2009 | Li et al. | |

* cited by examiner

*Primary Examiner*—C. J Arbes

(57) ABSTRACT

Chemical mechanical polishing (CMP) of thin film materials using a slurry including a surfactant chemical operative to polish high portions of the film being planarized while preventing the polishing of low portions of the film is disclosed. The low portions can be in a step reduction region of a deposited film. The CMP process can be used for form a planar surface upon which subsequent thin-film layers can be deposited, such as an electrically conductive material for an electrode. The subsequently deposited thin-film layers are substantially planar as deposited without having to use CMP. The resulting thin-film layers are planar and have a uniform cross-sectional thickness that can be beneficial for layers of memory material for a memory cell. The processing can be performed back-end-of-the-line (BEOL) on a previously front-end-of-the-line (FEOL) processed substrate (e.g., silicon wafer) and the BEOL process can be used to fabricate two-terminal non-volatile cross-point memory arrays.

30 Claims, 30 Drawing Sheets

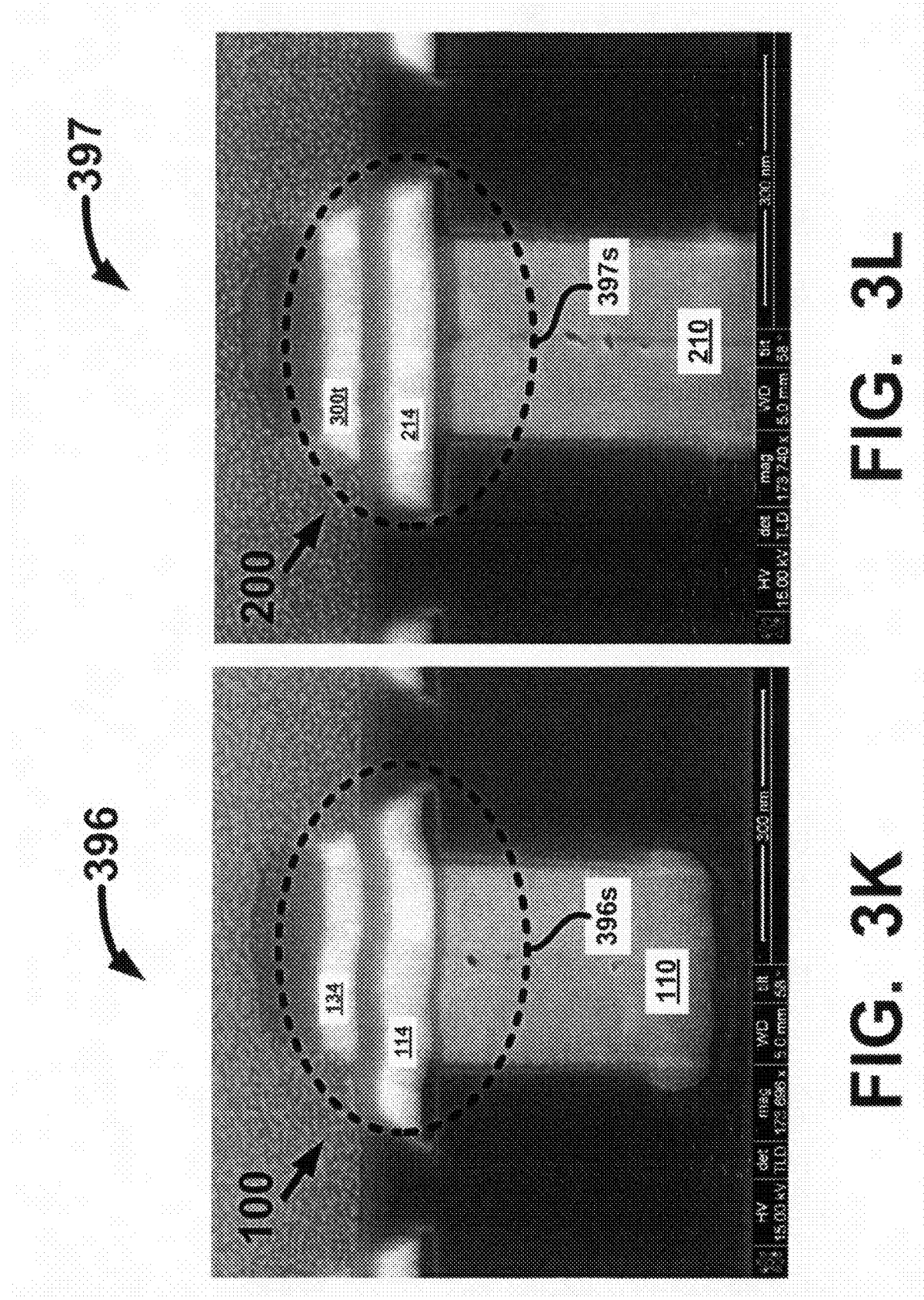

US 7,832,090 B1

METHOD OF MAKING A PLANAR ELECTRODE

FIELD OF THE INVENTION

The present invention relates generally to microelectronics fabrication processes. More specifically, present invention relates to chemical mechanical planarization of thin film materials.

BACKGROUND

Conventional microelectronics processes for forming an opening such as a trench, via, or plug in a dielectric layer include depositing the dielectric layer, patterning and then etching the dielectric layer to form the opening or a trench in the dielectric layer, depositing an electrically conductive material (e.g., tungsten—W or copper—Cu) in the opening, and then planarizing the tungsten film down to the dielectric material to form a substantially planar surface. Ideally, the dielectric layer and the electrically conductive material are smooth, planar, and substantially flush with each other.

In FIGS. 1A-1C, a conventional structure 100 depicts a dielectric layer 107 (e.g., SiO$_2$) and an electrically conductive structure 110 (e.g., tungsten—W or copper—Cu) positioned in a trench 107s formed in the dielectric layer 107. Although a trench structure is depicted, the electrically conductive structure could be a via, a plug, or the like. Trench 107s has a width along an X axis, a height along a Z axis, and a length along a Y axis (denoted 104). Here, the dielectric layer 107 has previously been patterned and etched to form the trench 107s, an electrically conductive material has been deposited in the trench 107s (e.g., using CVD, sputtering, or the like), and then the dielectric layer 107 and electrically conductive material have been planarized to form planar surface 107t and electrically conductive structure 110 positioned in the trench 107s. However, an upper surface of the electrically conductive structure 110 is recessed 107r below the planar surface 107t and the upper surface includes surface roughness 110r and seams 110s (also referred to as voids or divots). The recessed upper surface 107r is the result of the selective polishing slurry used in chemical mechanical polishing (CMP) process. As the CMP process is applied to those materials, the slurry used is selective to the electrically conductive material (e.g., tungsten—W or copper—Cu) used for the electrically conductive structure 110 than to the dielectric layer 107 (e.g., SiO$_2$) such that the electrically conductive material that fills the trench 107s is removed at a faster rate (e.g., polished faster) than the dielectric layer 107 and becomes recessed 107r below the planar surface 107t.

In FIGS. 1A-1C, lateral grains 110g grow inward from the sidewall surfaces of the trench 107s towards the center of the electrically conductive structure 110. The lateral grains cause formation of the aforementioned seams 110s that contribute to the surface roughness 110r. In some applications, prior to depositing the material for the electrically conductive structure 110, the sidewall surfaces of the trench 107s can be lined with a thin layer of an electrically conductive material 111 (e.g., titanium nitride—TiN and/or titanium—Ti) as depicted in structure 100a in FIG. 1B. However, the presence of the liner 111 does not remedy the aforementioned recess 107r, surface roughness 110r, or seams 110s; therefore, for purposes of discussion, the liner will not be depicted in subsequent FIGS.

In FIGS. 1A-1C, the dielectric layer 107, the electrically conductive structure 110, and other structures in those figures can be fabricated back-end-of-the-line (BEOL) directly on top of a substrate 150 (e.g., a silicon wafer) that includes circuitry 181 (e.g., CMOS circuitry) that is fabricated front-end-of-the-line (FEOL). The circuitry 181 is electrically coupled 185 with BEOL structure 103 via FEOL conductive structure 101. Here, because the FEOL structure is fabricated first and the BEOL structure is fabricated on top of the FEOL structure, the FEOL structure is depicted as being disposed along the −Z axis and the BEOL structure is depicted disposed along the +Z axis. For purposes of illustration, the FEOL structure may not be shown in FIGS. 1D-1O.

In FIG. 1D, a layer of material 112 (e.g., an electrically conductive adhesion layer of titanium nitride—TiN) is deposited 109c on the dielectric layer 107 and on the surface 110r of the electrically conductive structure 110. Due to the aforementioned seams 110s and the surface roughness 110r, the layer 112 fills in 110g the seams 110s and conformally covers surfaces 110r and 107t such that the surface roughness 110r is approximately replicated 112t in portions of the layer 112 that cover surface 110r of the electrically conductive structure 110. Although layer 112 is deposited to a thickness of t$_1$ as measured from surface 107t, the actual thickness varies (i.e., 112t) in those portions of the layer 112 that cover the electrically conductive structure 110 due to the surface roughness 110r. Therefore, subsequently layers of thin film materials that are deposited on the layer 112 will not be substantially planar due to the roughness 112t in layer 112 that can be replicated in the subsequently deposited thin film layers.

Turning now to FIG. 1E, a layer of electrically conductive material 114 (e.g., for an electrode) is deposited 114d on the layer 112 and the surface roughness 112t is approximately replicated 114t in the layer 114. In FIG. 1F, an adhesion or glue layer 116 (e.g., an electrically conductive adhesion layer of titanium nitride—TIN) is deposited on the layer 114 with surface irregularities 114t approximately replicated 116t in the layer 116. Following the deposition of layer 116, a layer of oxide 118 is deposited on the layer 116 and the layer 118 is patterned with a layer of mask material (e.g., lithographically patterned photoresist) to form etch mask 119. Next, the layer 118 is etched 119e to form a hard etch mask 118m depicted in FIG. 1G. Etch mask 119 can subsequently be removed using a stripping or ashing process. In FIGS. 1G through 1H, the hard mask 118m is used to etch 121e layers 116, 114, and 112 down to the surface 107t of oxide layer 107 using multiple etch steps (not shown) to form discrete stacks of thin film materials over the electrically conductive structures 110 in trenches 107s. It should be noted that the layers 116, 114, and 112 still retain the aforementioned surface roughness.

In FIG. 1I, a layer of dielectric material (e.g., SiO$_2$) 123 is deposited 125d over the structures depicted in FIG. 1H and in FIGS. 1J through 1K, a multi-step CMP process is used to remove material and to planarize the layers down to a plane 120p, which results in recessing the oxide 123 down to a plane 122p to completely remove the layer 116. In FIG. 1K, after the CMP process is completed, the layer 114 is not planar with the layer 123 and includes surface roughness 114t. Here, a slurry used in the CMP process for removing layer 116 may have been more selective to the oxide 123 than the material for layer 114 (e.g., platinum—Pt) such that the oxide 123 is polished faster than the layer 114 resulting in the oxide 123 being recessed below the layer 114 by an approximate distance ΔP as measured from a planar upper surface 123t to the highest point of the rough portions 114t of the layer 114. As was described above, the surface roughness 114t can be replicated in subsequently deposited thin film layers.

In FIG. 1L, two layers of thin film materials are deposited 131d on the structure depicted in FIG. 1K, a layer 126 and much thinner layer 128. Portions of the layers 126 and 128 are operative to form a memory element in a memory cell. In the example depicted, the layer 126 can be one or more layers of a conductive metal oxide (CMO) and the layer 128 can be a very thin layer of an electronically insulating material (e.g., YSZ) that can be approximately 50 Å or less in thickness. Here, surface roughness 114*t* is replicated 132*t* in layers 126 and 128 and causes variations in thickness of those layers such that along layer 128 a thickness $t_{B2}$ is thinner than a thickness $t_{B1}$ and along layer 126 a thickness $t_{C2}$ is thinner than a thickness $t_{C1}$. Portions of the layers 126 and 128 that are positioned over electrodes 114 form part of a memory element and the electrical characteristics of the memory element and performance of the memory element can be adversely affected by the aforementioned variations in layer thickness created by surface roughness (114*t*, 132*t*). For example, thickness variations in layer 128 can result in pinholes, shorts, variations in tunneling conduction, and non-uniform cell characteristics among memory cells in a memory array structure. Although only two layers (126, 128) are depicted, if additional layers are deposited above the layer 128, then the surface roughness can be replicated in those additional layers as well.

Turning now to FIG. 1M, a top down SEM image 160 of platinum (Pt) bottom electrodes (BE) 114 depicted in cross-sectional view in FIG. 1K illustrates the BE 114 including the surface roughness 114*t* that approximately replicates the surface roughness 112*t* (e.g., in FIG. 1E) and voids or seams in encircled areas that are due to the seams 110*s* in the electrically conductive structure 110 in the trenches 107*s* (e.g., in FIG. 1K).

Moving on to FIG. 1N, an electron microscope image 170 illustrates a cross-sectional image of the effects of surface roughness (112*t*, 114*t*, etc.) and seams 110*s* on the layers (126, 128). Here, lateral grains 110*g* cause seams 110*s* and surface roughness in layers 112 and 114. The distance ΔP between the surface of 123 and the highest portion of layer 114 is clearly evident. Consequently, the surface roughness in layer 114 is replicated in the layers 126 and 128. The layer 128 is so thin (e.g., <50 Å) that it can not be seen in image 170; however, the layer 128 follows the profile of layer 126 as depicted in the encircled region for layers (126, 128).

In FIG. 1O, an array current map depicts one consequence of the surface defects (e.g., surface roughness and seams) is non-uniformity in device parameters. Here, a plot 180 of current in nA for memory cells at different X and Y addresses in a memory array (e.g., a two-terminal cross-point array) depicts several memory cells with cell currents during data operations (e.g., read or write operations) that have currents 184 that are well in excess of 200 nA as depicted in the plot 180 and in the encircled area 186 in legend 188. As can be seen, some of the cells have currents in the 300 nA to 450 nA range. The excessive currents are indicative of memory cells (e.g., leaky cells) having high current leakage (e.g., 126 and 128) during data operations. Sense amp circuitry can be used for generating logic levels by determining a magnitude of a read current flowing through a memory cell during a read operation. Typically, one magnitude of a read current is indicative of a logic "0" (e.g., a high resistance programmed state) and another magnitude of read current is indicative of a logic "1" (e.g., a low resistance erased state). For leaky cells, the high magnitude of the leakage current prevents the sense amp circuitry from determining the read current of the cell being read because the magnitude of the leakage current is exceeds the range of acceptable values for read currents. High leakage currents can also interfere with the ability of the sense amp circuitry to determine the read current from other memory cells in the array.

Based on the foregoing FIGS. 1A-1N, it is preferable to reduce or eliminate surface roughness in thin film layers so that the layers that form the active portion of the memory element are planar surfaces that are uniformly thick across the entire memory array. It is also desirable to reduce the number of processing steps required to form the planar layers (e.g., the number of CMP processes). Fewer processing steps can reduce fabrication costs and can result in fewer defects and/or increased device yield.

There are continuing efforts to improve microelectronics fabrication processes for thin films.

BRIEF DESCRIPTION OF THE DRAWINGS

Various embodiments of the invention are disclosed in the following detailed description and the accompanying drawings:

FIG. 1O depicts an array current map of current flow through memory cells in a cross-point array versus X and Y addresses for the memory cells;

FIG. 3K depicts a focused ion beam image of a cross-section of a conventional memory cell including non-planar layers of thin film materials;

FIG. 3L depicts a focused ion beam image of a cross-section of a memory cell including planar layers of thin film materials;

Figure 1A:
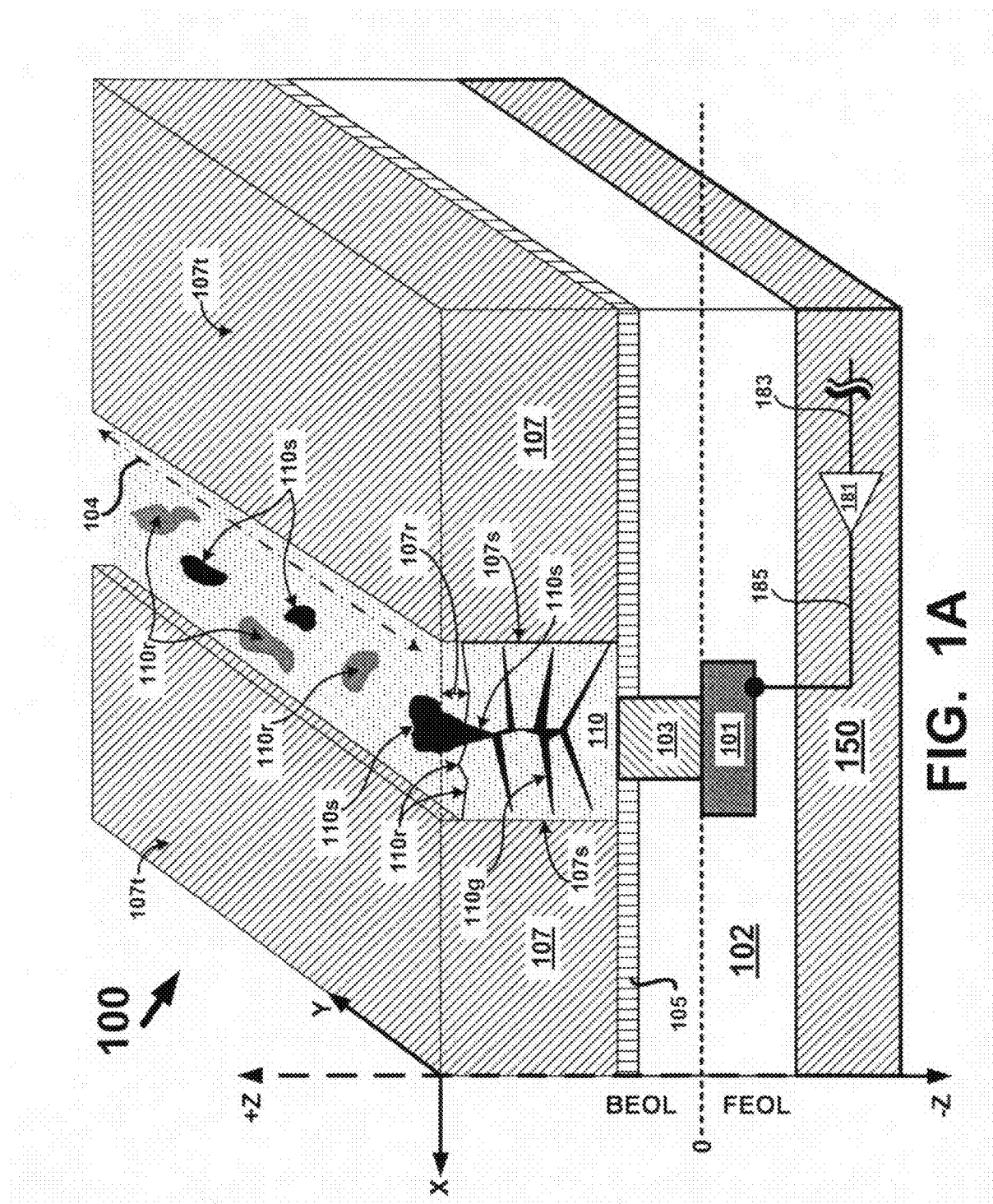
FIG. 1A depicts a profile view of an oxide layer including an electrically conductive structure formed in a trench.
Figure 1B:
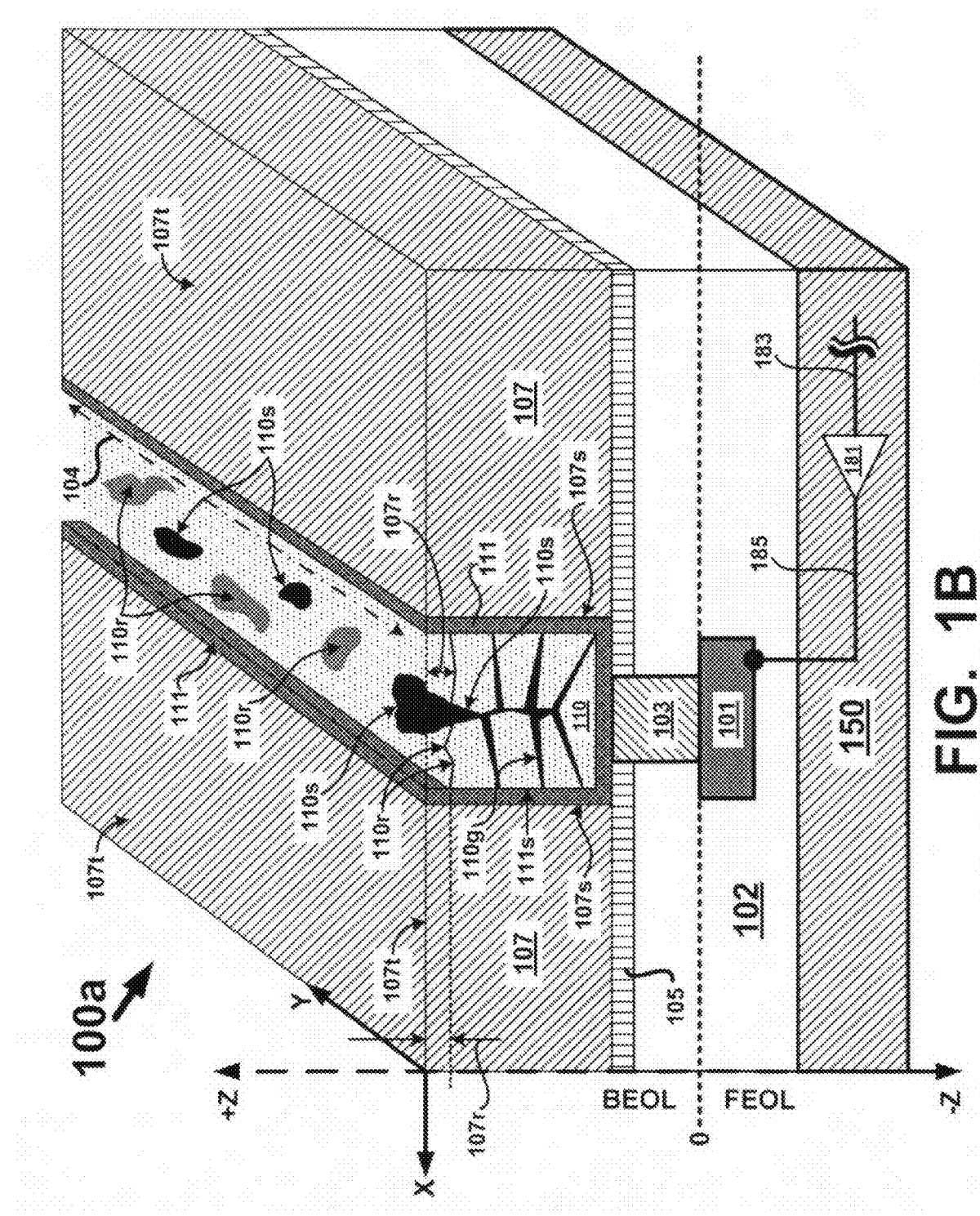
FIG. 1B depicts a profile view of an oxide layer including a liner and an electrically conductive structure formed in a trench.
Figure 1C:
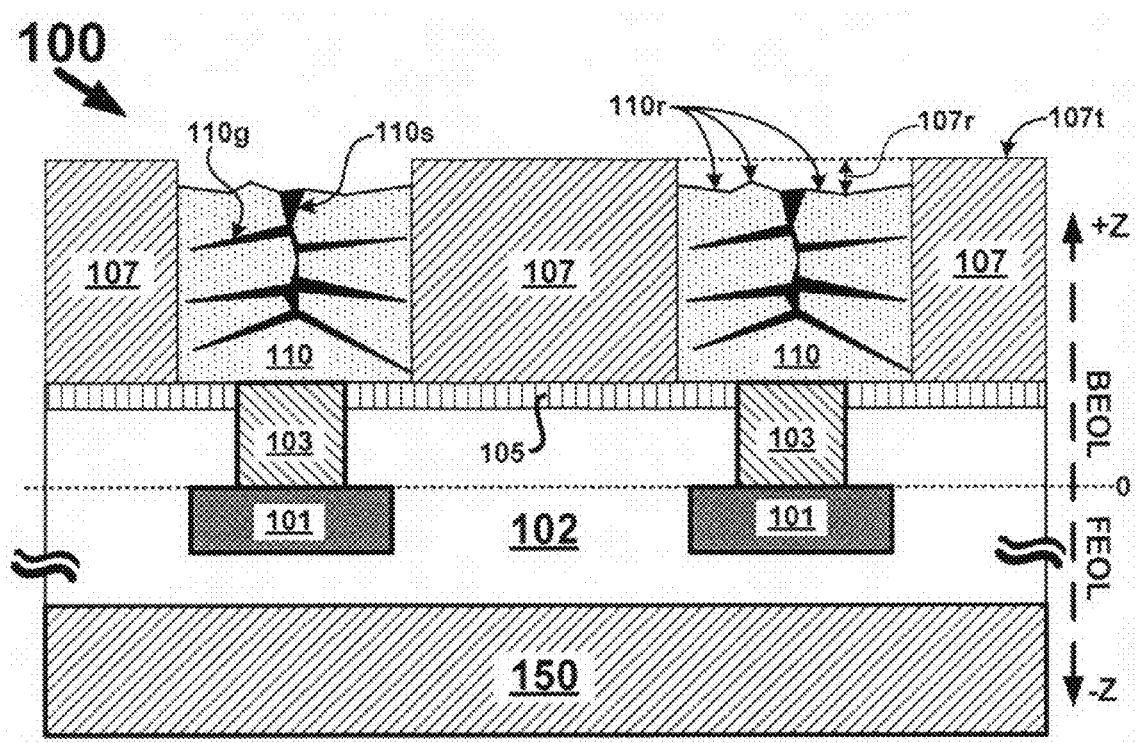
FIG. 1C depicts a cross-sectional view of an oxide layer including an electrically conductive structure formed in a trench and including seams and surface roughness.
Figure 1D:
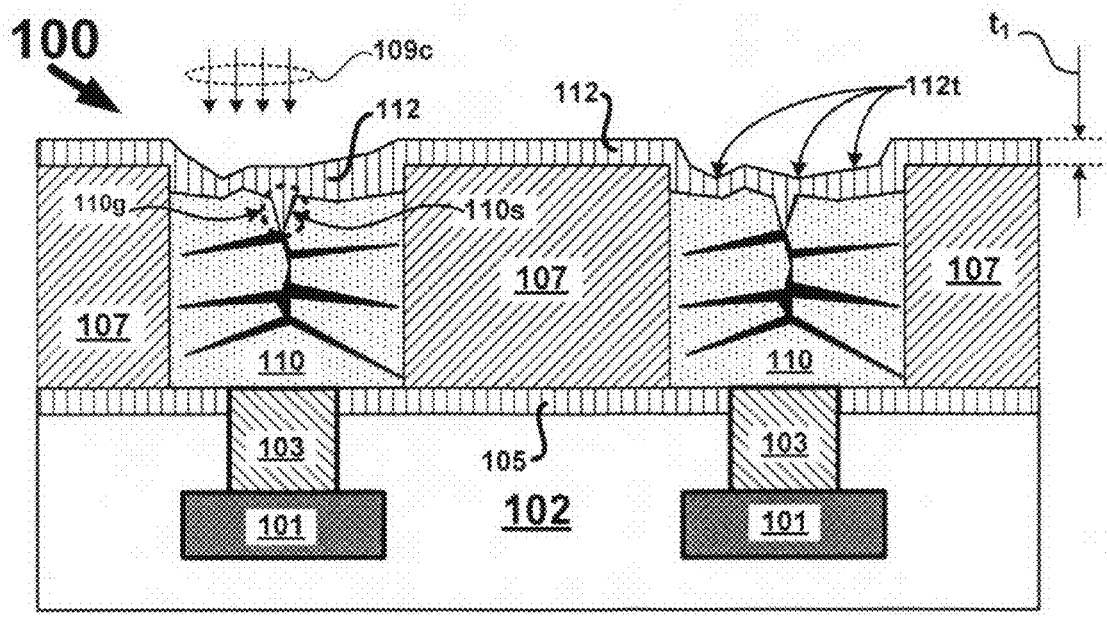
FIG. 1D depicts a cross-sectional view of a glue layer deposited on the structure of FIG. 1C.
Figure 1E:
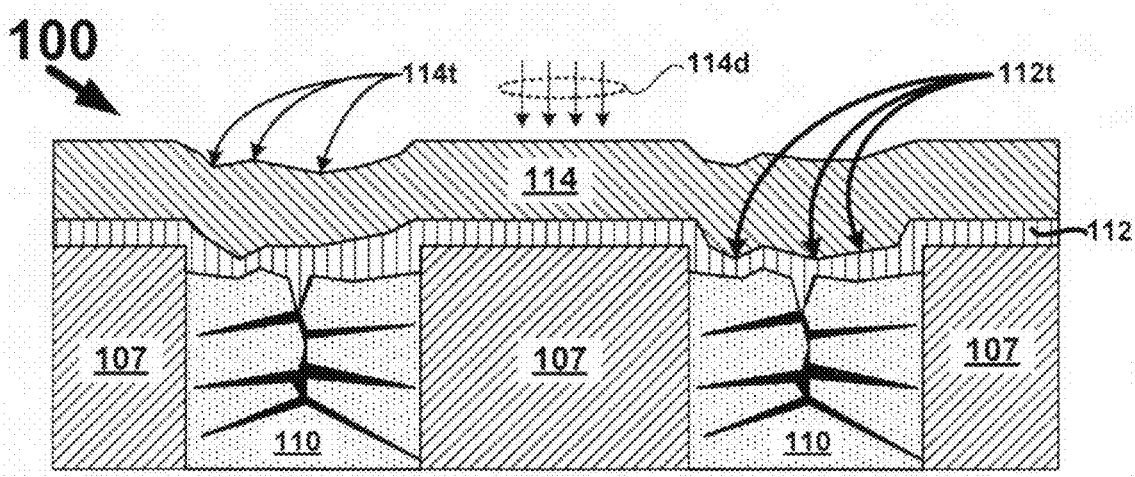
FIG. 1E depicts a cross-sectional view of a layer of an electrically conductive material deposited on the structure of FIG. 1D.
Figure 1F:
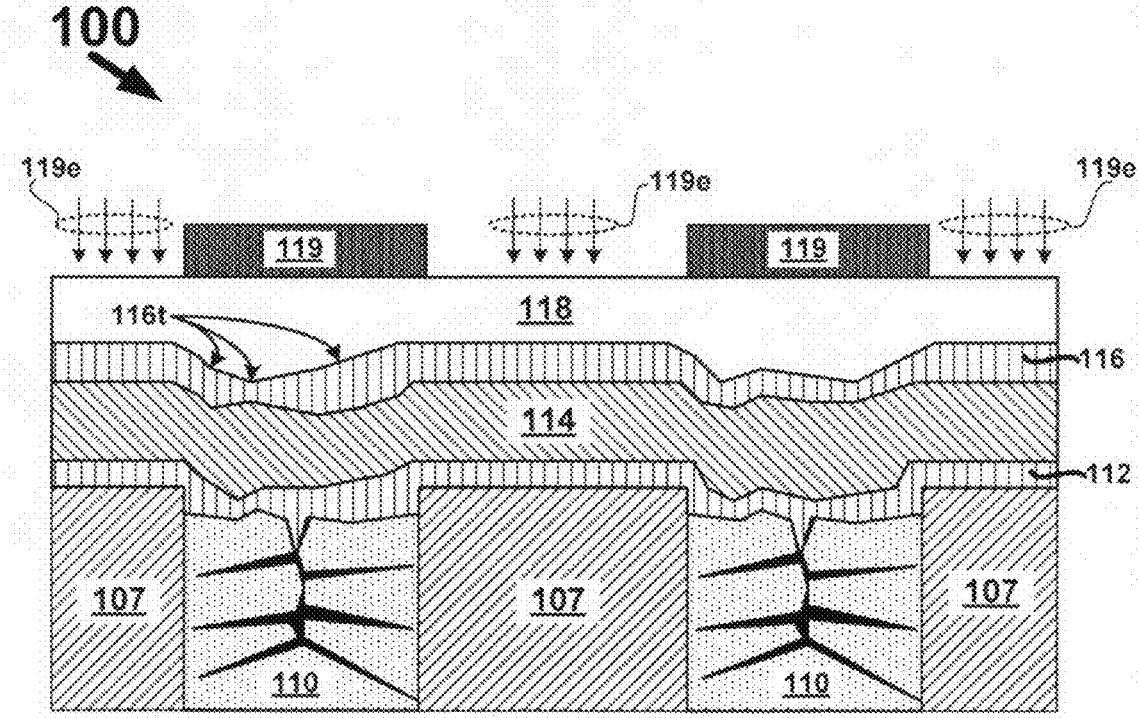
FIG. 1F depicts a cross-sectional view of the structure of FIG. 1E after subsequent deposition and patterning processes.
Figure 1G:
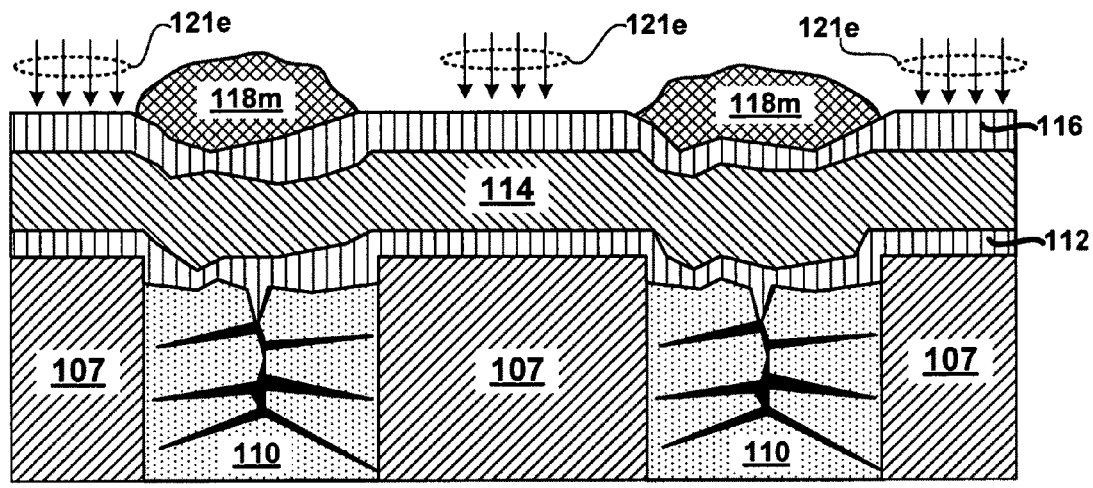
FIGS. 1G through 1H depict cross-sectional views of etching of several thin film layers using a hard mask.
Figure 1H:
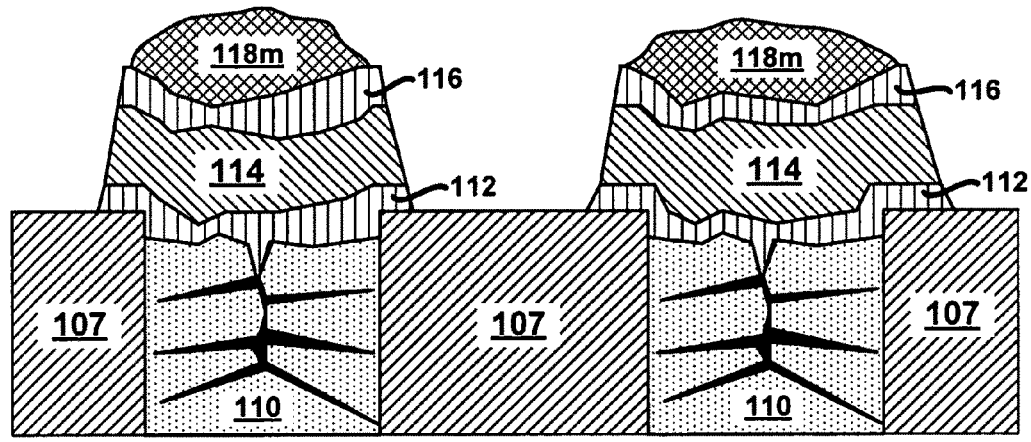
Figure 1I:
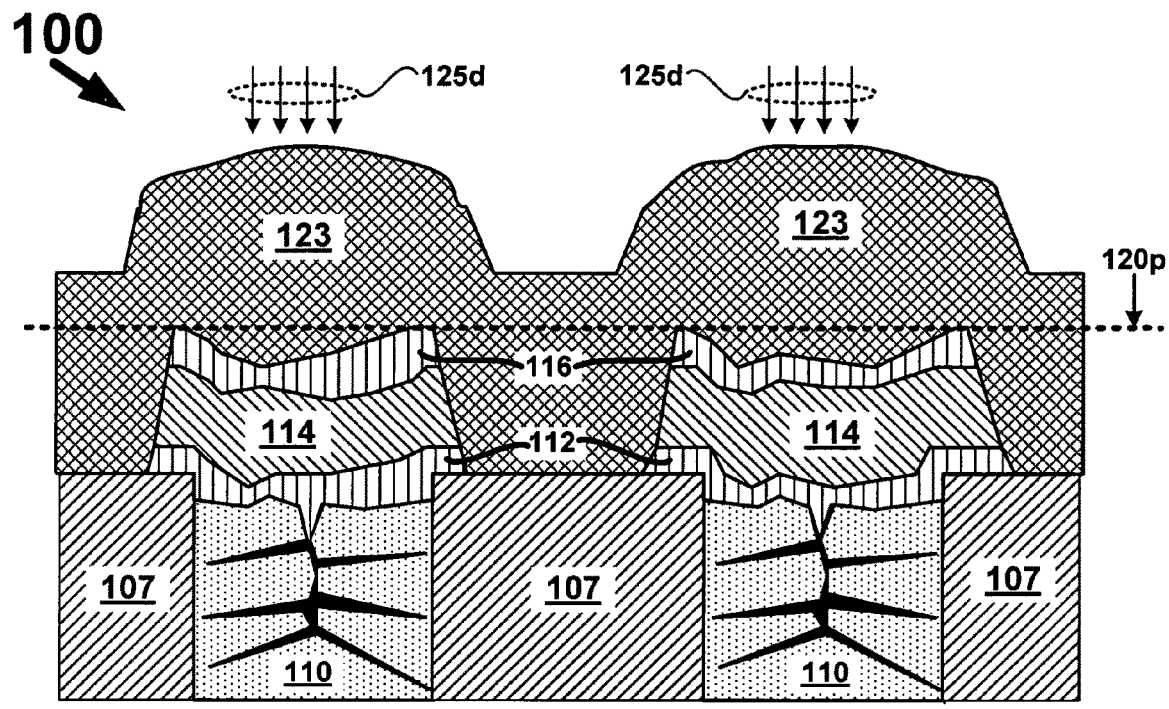
FIG. 1I depicts a cross-sectional view of a deposition of a dielectric layer.
Figure 1J:
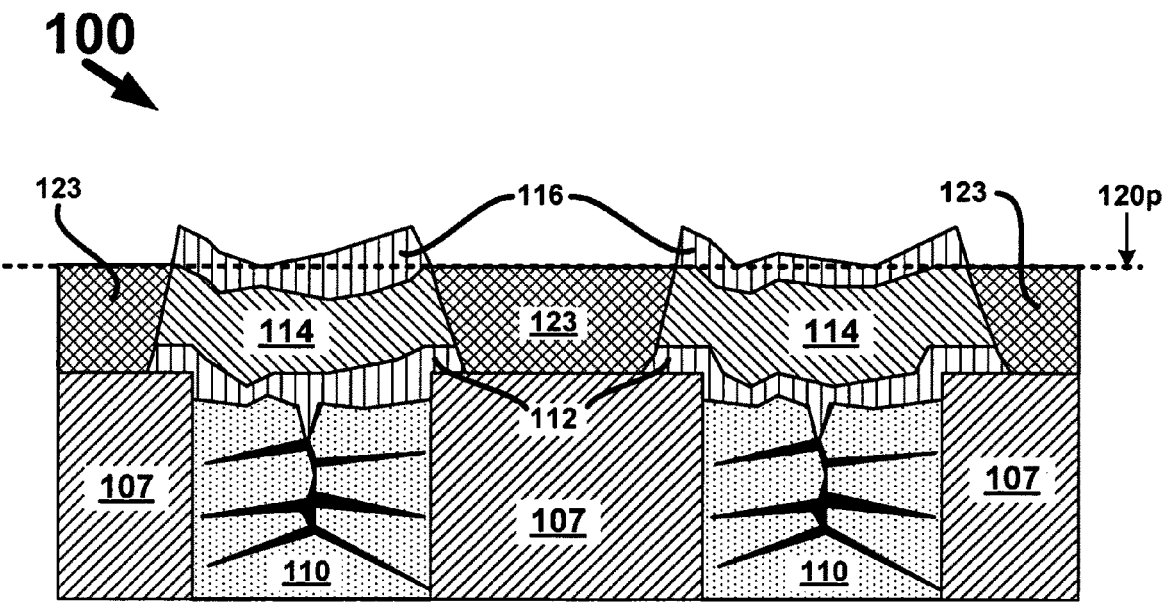
FIG. 1J depicts a cross-sectional view of the structure of FIG. 1I after a first CMP process.

Although the above-described drawings depict various examples of the invention, the invention is not limited by the depicted examples. It is to be understood that, in the drawings, like reference numerals designate like structural elements. Also, it is understood that the drawings are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description. The described fabrication techniques may be varied and are not limited to the examples provided.

Figure 2A:
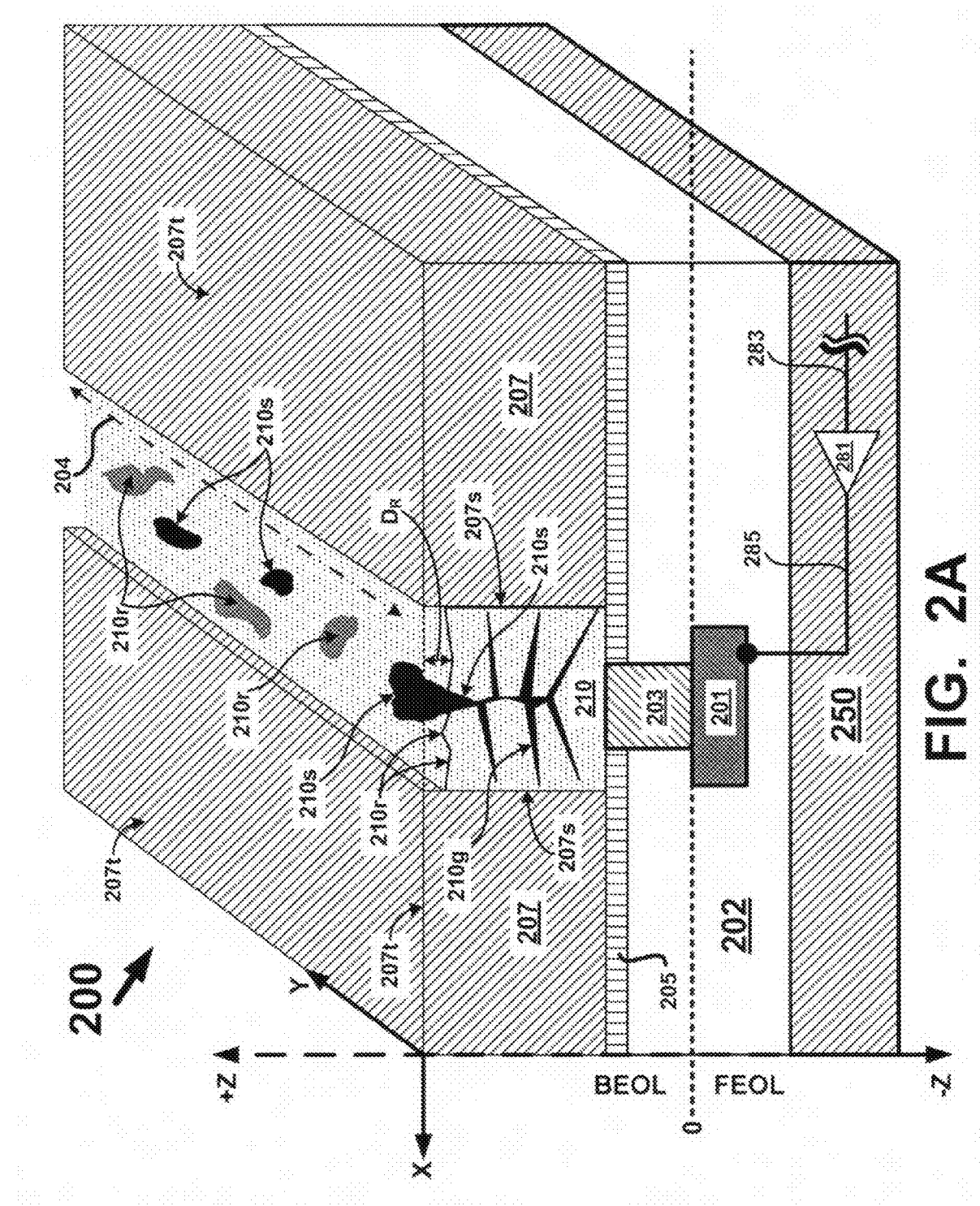
FIG. 2A depicts a profile view of an oxide layer including an electrically conductive structure formed in a trench.
Figure 2B:
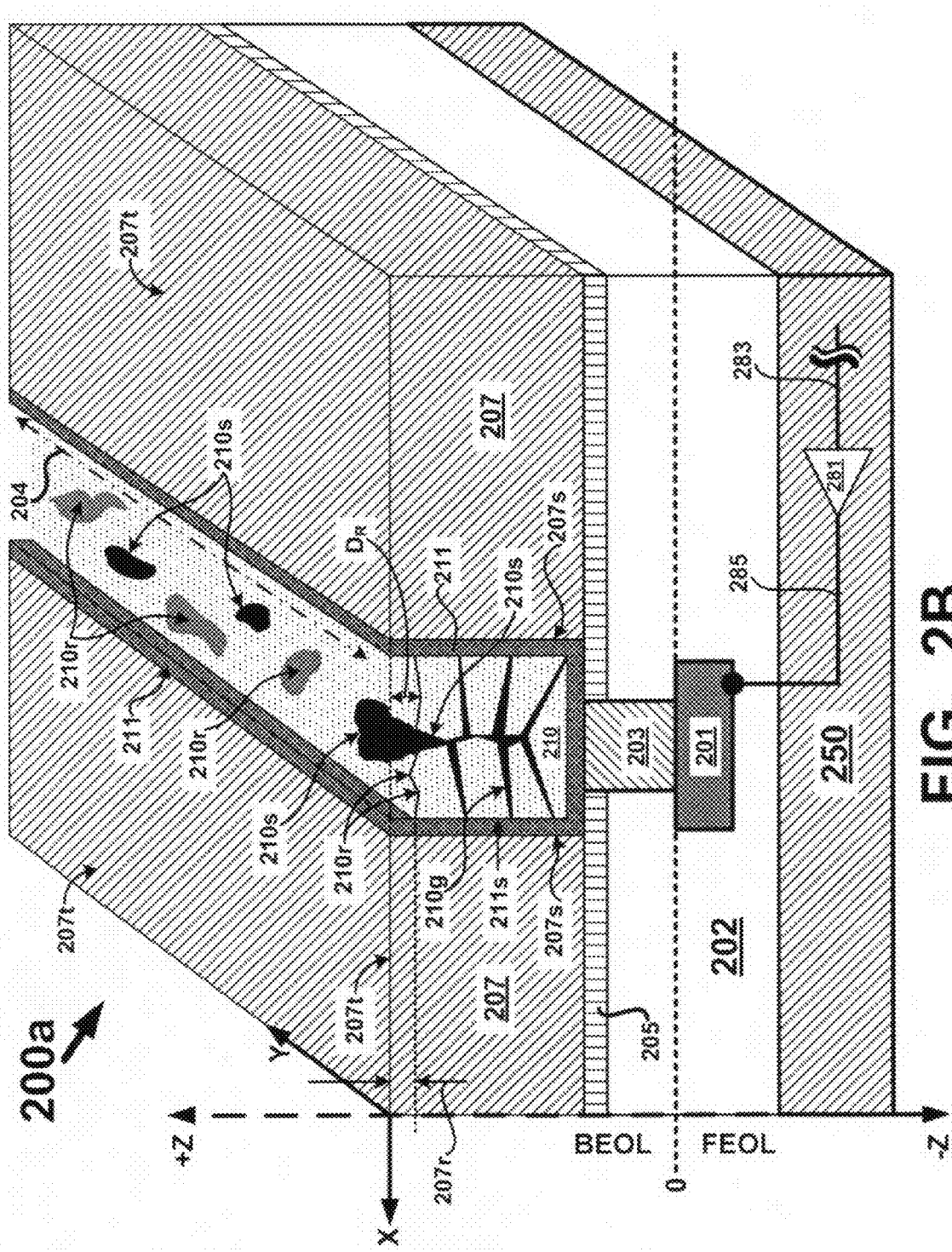
FIG. 2B depicts a profile view of an oxide layer including a liner and an electrically conductive structure formed in a trench.
Figure 2C:
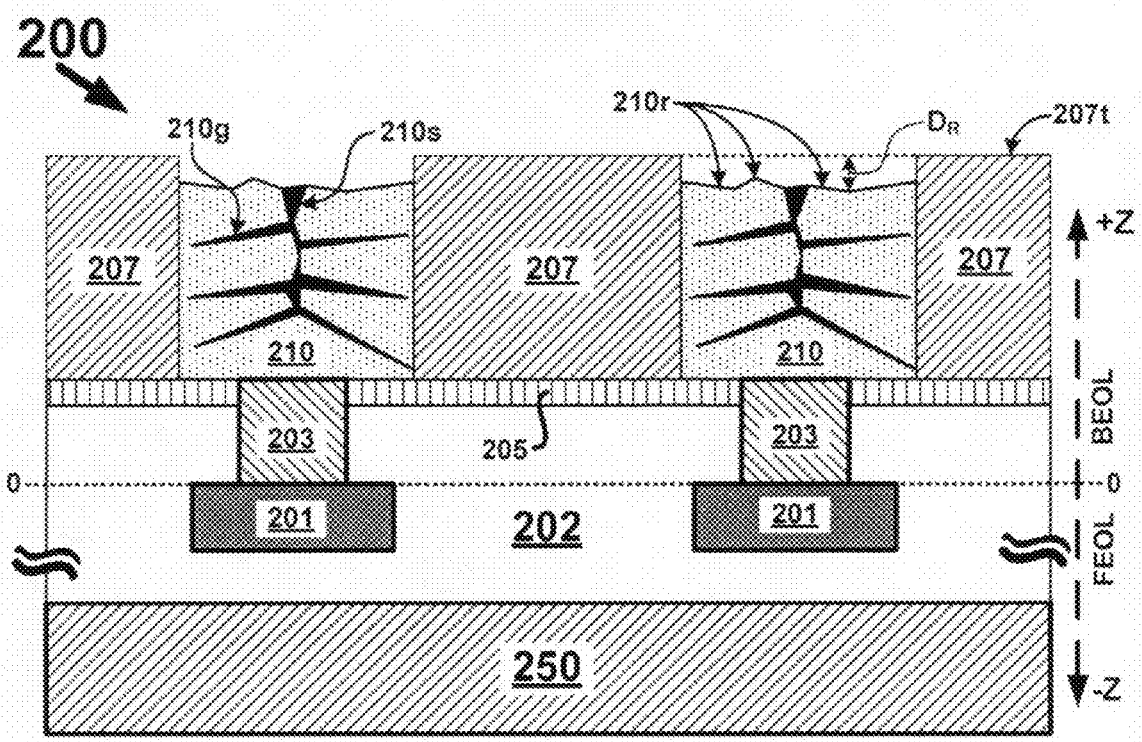
FIG. 2C depicts a cross-sectional view of an oxide layer including an electrically conductive structure formed in a trench and including seams and surface roughness.

Attention is now directed to FIGS. 2A-2C, where a structure 200 depicts a dielectric layer 207 (e.g., $SiO_2$) and an electrically conductive structure 210 (e.g., tungsten—W or copper—Cu) positioned in a trench 207s formed in the dielectric layer 207. Although a trench structure is depicted, the electrically conductive structure could be a conductive structure used in a microelectronics device such as a via, a plug, or the like. Trench 207s has a width along an X axis, a height along a Z axis, and a length along a Y axis (denoted 204). As depicted, the dielectric layer 207 has previously been patterned and etched to form the trench 207s, an electrically conductive material has been deposited in the trench 207s (e.g., using CVD, sputtering, or the like), and then the dielectric layer 207 and electrically conductive material have been planarized to form a planar upper surface 207t on the dielectric layer 207 and electrically conductive structure 210 positioned in the trench 207s. However, an upper surface of the electrically conductive structure 210 is non-planar and is recessed a distance $D_R$ below the planar surface 207t. The non-planar upper surface of the electrically conductive structure 210 includes surface roughness 210r and seams 210s. The seams 210s can also be referred to as voids or divots. The recess in the upper surface $D_R$ results from employing a selective polishing slurry, which is used in chemical mechanical polishing (CMP). As the CMP process is applied to those materials, the slurry can be more selective to the electrically conductive material (e.g., tungsten—W or copper—Cu) used for the electrically conductive structure 210 than to the dielectric layer 207 (e.g., $SiO_2$) such that the electrically conductive material in trench 207s is removed at a faster rate (e.g., polished faster) than the dielectric layer 207. As a result, the faster polishing rate on the electrically conductive structure 210 forms the recess $D_R$ below the planar surface 207t. The distance the upper surface of the electrically conductive structure 210 is recessed $D_R$ below the planar surface 207t varies due to the variation in the total polish time required to remove all the conductive material above the dielectric. The distance $D_R$ can be the maximum distance or an average distance.

In FIGS. 2A-2C, lateral grains 210g grow inward from the sidewall surfaces of the trench 207s towards the center of the electrically conductive structure 210. The lateral grains cause the formation of the seams and voids 210s and the seams and voids 210s contribute to the surface roughness 210r. Referring now to FIG. 2B, in some applications, prior to depositing the material for the electrically conductive structure 210, the sidewall surfaces of the trench 207s can be lined with a thin layer of an electrically conductive material 211 (e.g., titanium nitride—TiN) as depicted in structure 200a. For example, the liner 211 can be used to promote adhesion between materials (e.g., between 207 and 210) or to partially encapsulate the electrically conductive structure 210. The liner 211 can be conformally deposited in the trench 207s. However, the presence of the liner 211 does not remedy the aforementioned recess $D_R$, surface roughness 210r, or seams 210s; therefore, for purposes of discussion, the liner may not be depicted in subsequent FIGS.

For example, electrically conductive structure 210 can be made from tungsten (W) that is deposited using chemical vapor deposition (CVD). The nature of CVD deposited tungsten (W) for sub-micron feature sized structures (e.g., conductor 210) results in the laterally oriented grains 210g that join in the center of the conductor 210 to form the seams 210s.

In FIGS. 2A-2C, the dielectric layer 207, the electrically conductive structure 210, and other structures in those figures can be fabricated back-end-of-the-line (BEOL) directly on top of a substrate 250 (e.g., a silicon wafer) that includes circuitry 281 (e.g., CMOS circuitry) that is fabricated front-end-of-the-line (FEOL). Layer 205 can be a material used as a glue or adhesion layer (e.g., titanium nitride—TiN). The circuitry 281 is electrically coupled 285 with BEOL structure 203 via FEOL conductive structure 201. Here, because the FEOL structure is fabricated first and the BEOL structure is fabricated on top of the FEOL structure, the FEOL structure is depicted as being disposed along the −Z axis and the BEOL structure is depicted disposed along the +Z axis (e.g., above the 0 point on the Z axis). For purposes of illustration, the FEOL structure may not be shown in subsequent FIGS. It should be noted that the present invention is not limited to the structure depicted in FIGS. 2A-2C and the method and structure for a planar electrode can be applied to processes for FEOL structures, BEOL structures, or both FEOL and BEOL structures. Moreover, although the present invention describes forming a planar electrode, the planar surfaces formed need not be an electrode or and electrically conductive structure. The present invention can be applied to fabrication processes where the forming planar surface(s) is necessary to achieve a desired structure. As will be described in greater detail below, non-planar layers and/or surface roughness in a layer can be replicated in subsequently deposited layer(s). It may be desirable for the subsequently deposited layers (e.g., thin film materials) to be deposited on a planar surface so that those subsequently deposited layers do not require planarization and/or to promote a uniformity of layer thickness in the subsequently deposited layers.

Figure 2D:
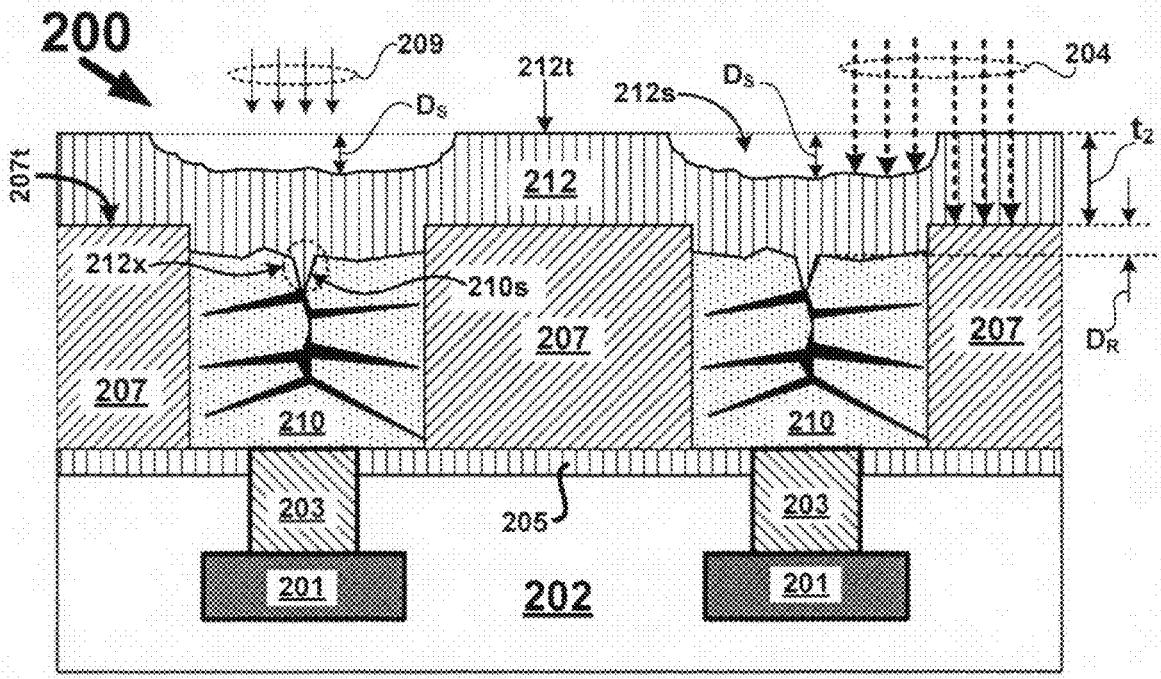
FIG. 2D depict a cross-sectional view of an adhesion layer deposited to a thickness that is greater than the thickness of dished regions in the layer and recessed regions in the trench.

Moving on to FIG. 2D, after the CMP of the structure 200 in FIG. 2C, an overburden layer 212 of an adhesion material (e.g., titanium nitride—TIN or tantalum nitride—TaN) is deposited 209 on the layer 207 and conformally covers the planar upper surface 207t and the non-planar 210r and recessed $D_R$ upper surface of the electrically conductive structure 210 (conductor 210 hereinafter). The layer 212 can also partially or completely fill in the seams 210s as denoted by dashed line 212x. The conformal profile of the layer 212 results in a step reduction in the layer 212 that is positioned proximately over the recessed portions $D_R$ of the conductor 210. The step reduction can be referred to as a recess region of the layer 212 and is denoted as a distance $D_S$ as measured from a surface 212t. The distance $D_S$ varies along the profile of the dished region and at its maximum distance can be approximately equal to a maximum distance of the recessed region $D_R$. For example, if the maximum distance the upper surface of the conductor 210 is recessed $D_R$ below the surface 207t is about 200 Å, then the distance $D_S$ can be about 200 Å also.

The distance $D_S$, $D_R$, or both can be used to determine a deposition thickness $t_2$ for the layer 212 as measured from the surface 207t. The thickness $t_2$ can be used to determine how much of the layer 212 should be removed in a subsequent planarization process that will be described below. Several methods can be used to determine deposition thickness $t_2$ based on values for $D_S$ and $D_R$. First, the values for $D_S$ and $D_R$ can be summed and deposition thickness $t_2$ can be selected to be greater than or equal to the sum of $D_S$ and $D_R$ (e.g., thickness $t_2 \geq D_S + D_R$). Second, if $D_S$ is approximately 270 Å, then $t_2$ can be selected to be greater than or equal to twice the value of $D_S$ (e.g., thickness $t_2 \geq 2 \times D_S$) such that $t_2$ can be about 600 Å. Third, if $D_R$ is approximately 240 Å, then $t_2$ can be selected to be greater than or equal to twice the value of $D_R$ (e.g., thickness $t_2 \geq 2 \times D_R$) such that $t_2$ can be about 500 Å. Consequently, thickness $t_2$ can be a function of $D_S$, $D_R$, or both.

Figure 2E:
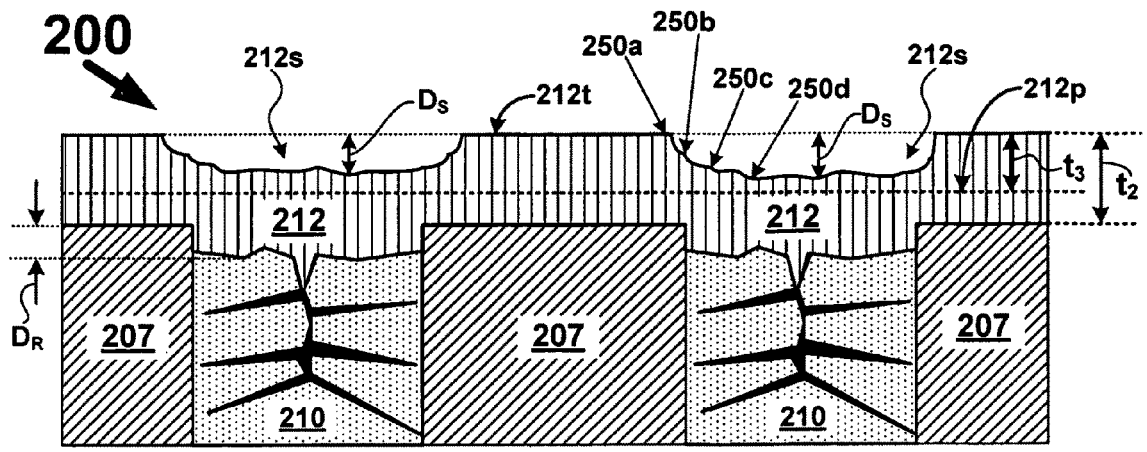
FIG. 2E depicts a cross-sectional view of a planarization distance for planarizing the adhesion layer below bottommost portions of the dished regions.

Reference is now made to FIG. 2E where a distance $t_3$ as measured from surface 212t is calculated based on the value of $t_2$ where $D_S < t_3 < t_2$. Here, $t_3$ must be greater than $D_S$ so that a plane of the planarized surface of layer 212 falls below the dished regions 212s as denoted by a dashed line 212p. As one example, if $t_2 \approx 600$ Å and $D_S \approx 270$ Å, then $t_3$ can be selected to be: $t_3 \approx 350$ Å as measured from surface 212t. As another example, if $D_S \approx 240$ Å, then $t_3$ can be selected to be: $t_3 \approx 300$ Å such that $t_3 > D_R$. Accordingly, in either example, the line 212p will be positioned below the bottommost portions of the step reductions 212s as depicted in FIG. 2E so that the planarization process will completely remove the step reduction 212s portions of the layer 212.

Figure 2F:
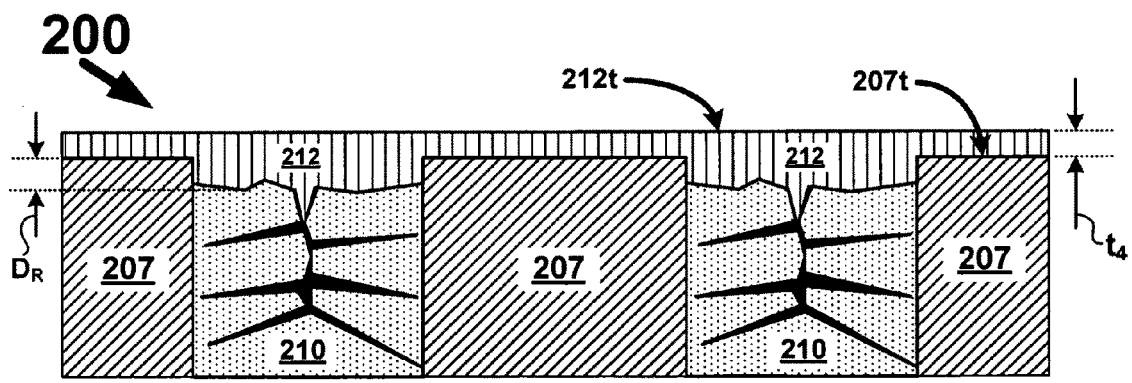
FIG. 2F depicts a cross-sectional view of one example of an adhesion layer after planarization.
Figure 2G:
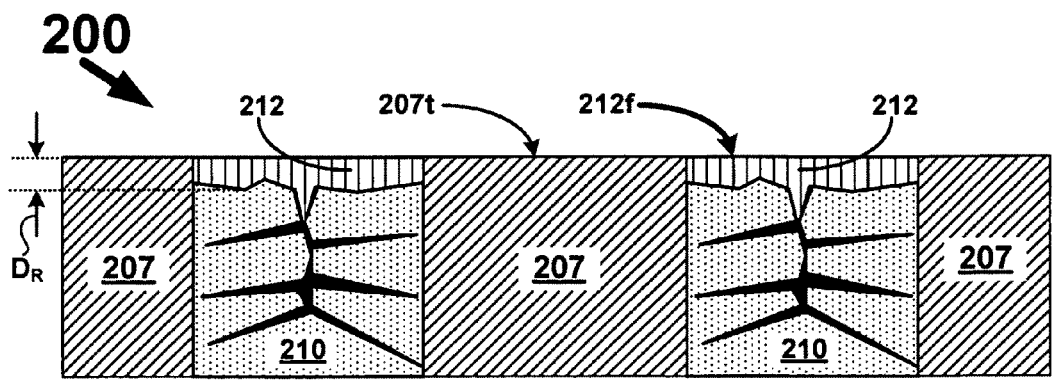
FIG. 2G depicts a cross-sectional view of another example of an adhesion layer after planarization.

Referring now to FIGS. 2F and 2G, the layer 212 is planarized using chemical mechanical planarization (CMP) to form a planar surface 212t on layer 212 positioned a distance $t_4$ as measured from surface 207s (FIG. 2F) or a planar surface 212f that is co-planar (e.g., flush) with surface 207s (FIG. 2G). The surface 212t or surfaces (212f, 207s) can serve as planar surfaces upon which additional thin film layers can be subsequently deposited on (e.g., a layer of an electrically conductive material for an electrode). By providing a planar base layer as a foundation upon which to deposit additional layers of thin film materials, at least some of those additional layers of thin film material can be deposited on a substantially smooth and planar surface resulting in layers that conform to the profile of the planar surface and are substantially planar layers without applying CMP to make the layers planar. For purposes of explanation, the configuration depicted in FIG. 2G may not be shown in some of the FIGS.

One problem with conventional CMP processes is that the slurry used for removing material from the layer being polished is selected based on a desired selectivity to a specific material to be removed by the polishing action of the slurry and polishing pad. As the CMP process is applied, the material the slurry is selective to will be removed by the polishing action at a faster removal rate than other materials the slurry is not selective to or is less selective to.

Referring back to FIGS. 2E through 2F, it is desirable to planarize the layer 212 below the step reduction 212s portions to form the planar surface 212t or 212f. However, each step reduction 212s includes a surface profile having some portions that are higher or lower than other portions as depicted by four portions of decreasing height from left to right in the step reduction 212s in FIG. 2E and denoted as: 250a; 250b; 250c; and 250d. As planarization on the layer 212 proceeds, it is desirable for material in the high portions (e.g., 250a) of the step reduction 212s be removed by CMP while material in lower portions (e.g., 250b, 250c, and 250d) are not removed. As the higher portions are removed and the layer 212 is progressively planarized down to the lower portions, the next lowest portion (e.g., 250b) is removed while even lower portions (e.g., 250c and 250d) are not removed.

CMP Material Selection

To achieve the progressive removal of high portions of the step reduction 212s, a CMP polishing compound is selected that includes a surfactant chemical to allow: (a) the polishing compound to polish the layer 212 and to preferentially polish only the high portions of the recessed regions 212s; and (b) to prevent the polishing compound from polishing the low portions of the dished regions 212s. The polishing compound can be manufactured to include the surfactant chemical or the surfactant density can be modified to the polishing compound. The surfactant increases planarization efficiency by filling in the low portions and preventing abrasive particles in the slurry from abrading the surface of the low portions while allowing for a high material removal rate of the high portions which are positioned closer to the polishing pad. High planarization efficiency results in the high portions being polished down to join the low portions. The CMP can be halted when the layer 212 is planar and smooth (e.g., 212t or 212f). For example, CMP can be halted sometime after the lowest portion of the dished regions 212s have been removed as depicted by dashed line 212p in FIG. 2E and the uppermost surface (e.g., 212t or 212f) of the layer 212 is planar and smooth.

The CMP machine can be an IPEC 472 Chemical Mechanical Polisher fitted with the following: a Down™ Chemical Company IC1000 K-groove polishing pad; a wafer carrier head with a soft back; and a diamond pad conditioner for conditioning the polishing pad. The polishing compound can be ceria based CMP slurry that includes the surfactant. For example the slurry can be a DuPont™ EKC 2100 RA3 slurry. The pressure applied by the carrier head will be applications dependent. For CMP of TiN, the pressure can be in a range from about 2 psi to about 5 psi.

FIGS. 2H through 2P depict optional additional process steps that can be applied to the structure 200 after the planarization of the layer 212 as depicted in FIGS. 2F and 2G. However, if a structure other than a memory cell is called for and requires a planar layer of material, such as the planarized layer 212, then subsequent processing can be done to fabricate the other structure in a manner different than that depicted in FIGS. 2H-2P.

Figure 2H:
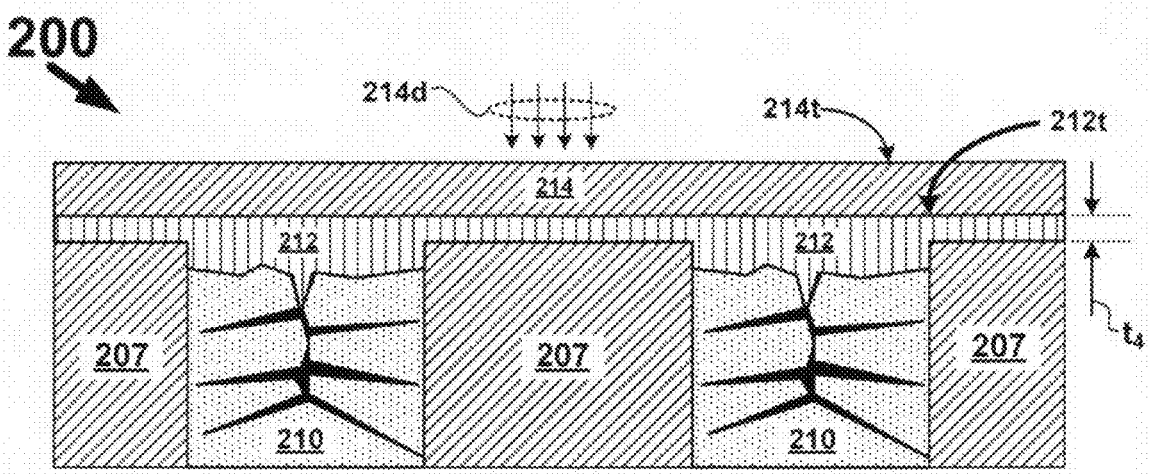
FIG. 2H depicts a cross-sectional view of a planar layer of an electrically conductive material deposited on a planar adhesion layer.

In FIG. 2H, an electrically conductive material 214 is deposited 214e on the smooth and planar surface 212p. A surface 214t is planar as deposited because the layer 214 is deposited on the planar surface 212p and is conformal to the surface profile of the layer 212. Consequently, the surface 214t is planar without having to apply a planarization process such as CMP to the layer 214.

Figure 2I:
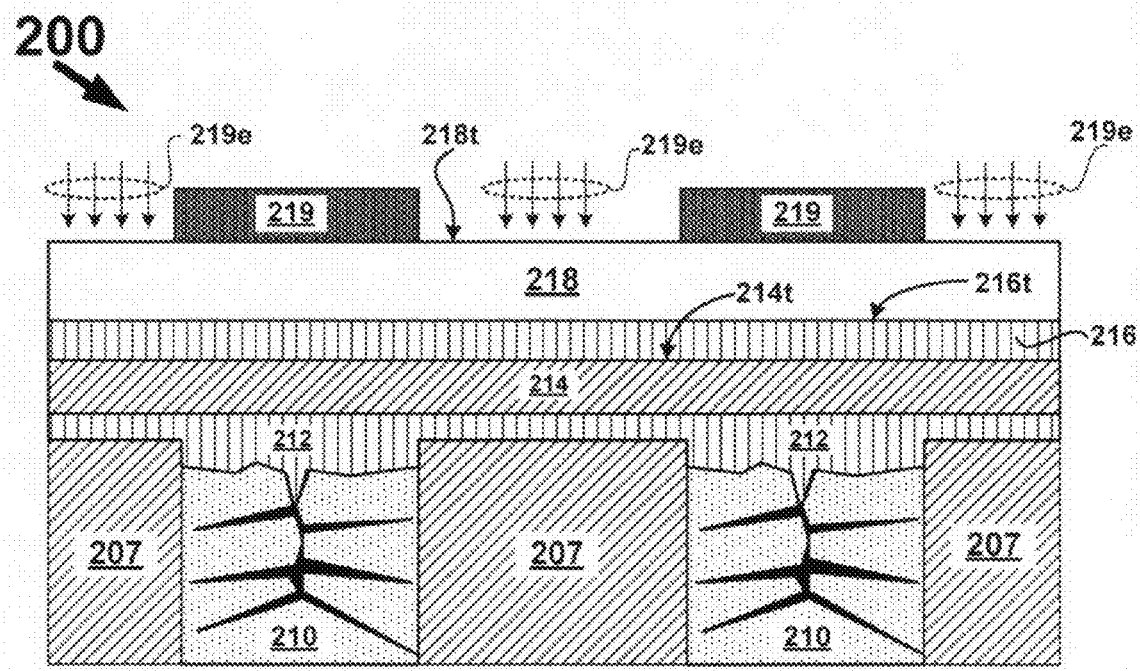
FIG. 2I depicts a cross-sectional view of additional planar thin film layers deposited on the planar layer of electrically conductive material.

In FIG. 2I, an electrically conductive adhesion layer 216 (e.g., TiN) is deposited on layer 214 followed by a dielectric layer 218 (e.g., $SiO_2$). Upper surfaces 218t and 216t of those layers are also planar as deposited due to being deposited on planar surfaces, that is, 216t deposited on 214t and 218t deposited on 216t. The layer 218 is patterned (e.g., using photoresist) and etched 219e (e.g., using plasma etching) to form an etch mask 219 for a subsequent etching process.

Figure 2J:
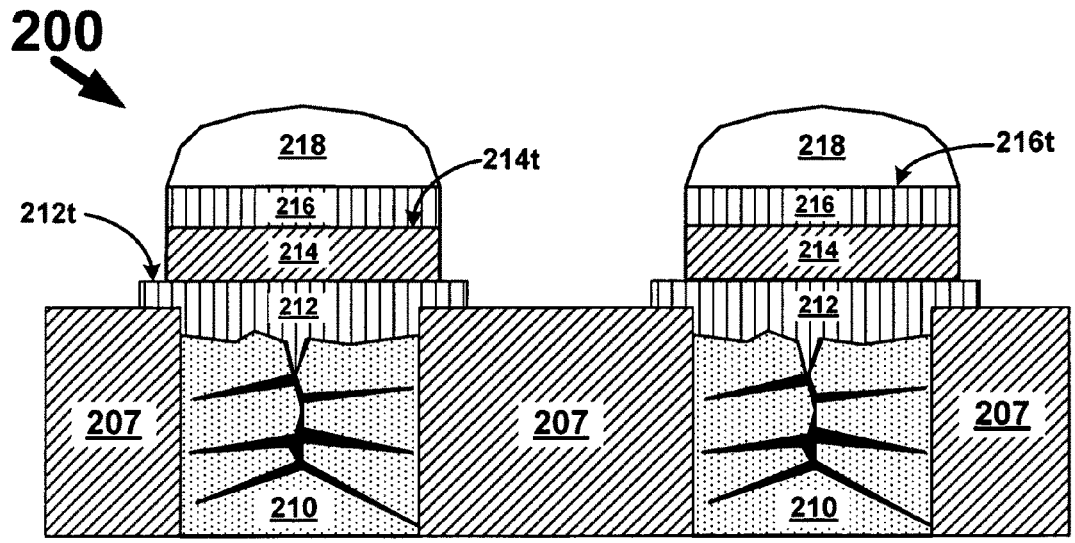
FIG. 2J depicts a cross-sectional view of some of the thin film layers in FIG. 2I after those layers have been patterned and etched.
Figure 2K:
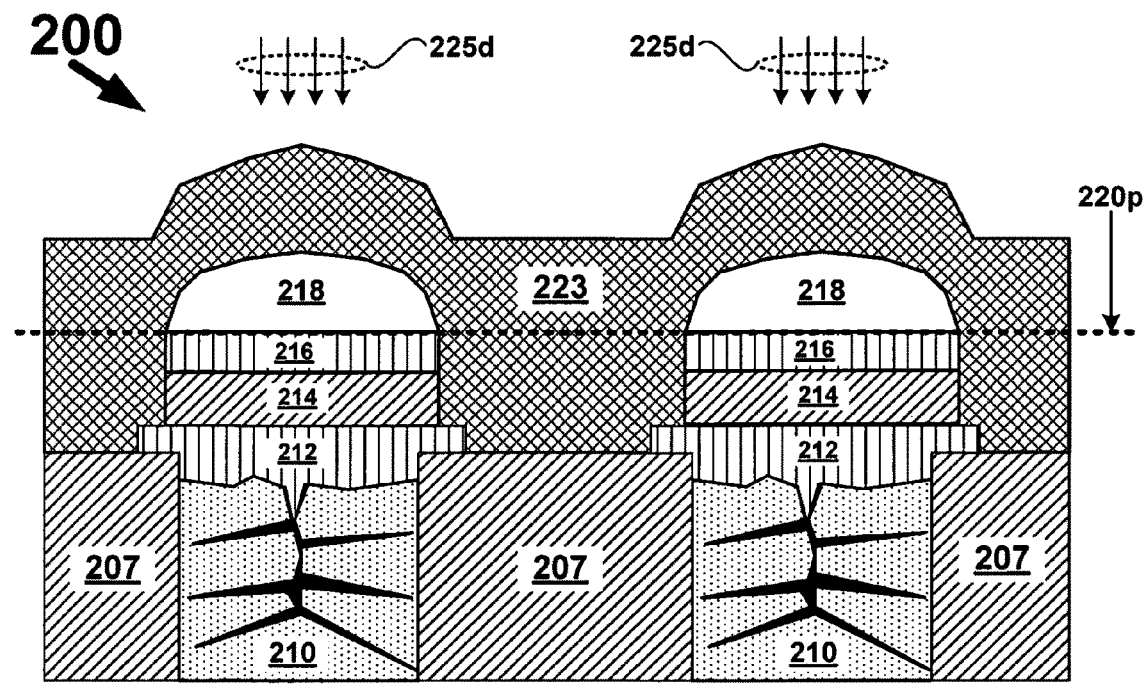
FIG. 2K depicts a cross-sectional view of a layer of dielectric material deposited on the thin film layers of FIG. 2J.

Moving on to FIG. 2J, the layers 218, 216, 214, and 212 have been etched 219e down to the layer 207 to form a stack of thin film layers positioned over each conductor 210. After the etching 219e, the layers 216, 214, and 212 are no longer continuous layers so that the stacks are electrically isolated from one another. In FIG. 2K, a dielectric material 223 (e.g., $SiO_2$) is deposited 225d over the stack depicted in FIG. 2J and conformally covers the stacks. The layer 223 and 218 will be subsequently planarized using CMP down to the layer 216 as depicted by dashed line 220p.

Figure 2L:
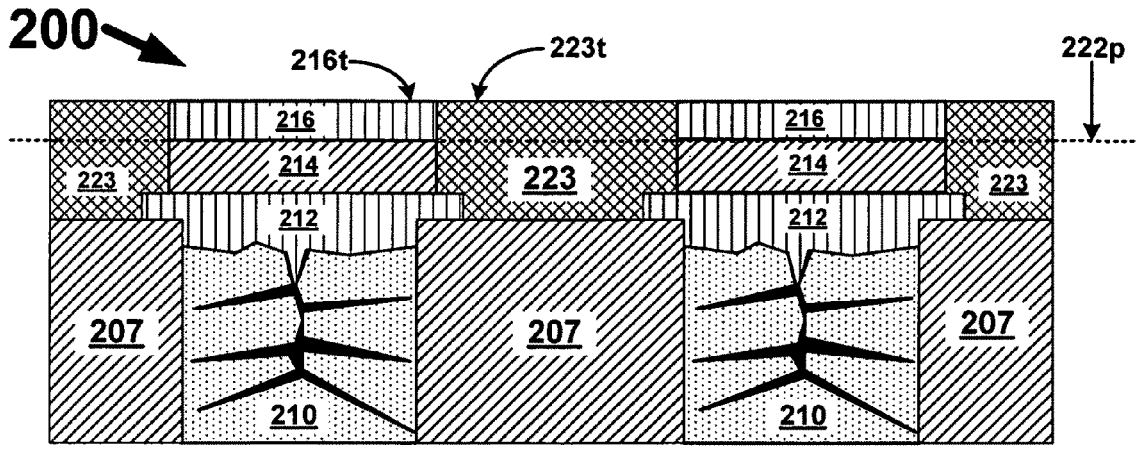
FIG. 2L depicts a cross-sectional view of a first planarization of some of the thin film layers in FIG. 2K.
Figure 2M:
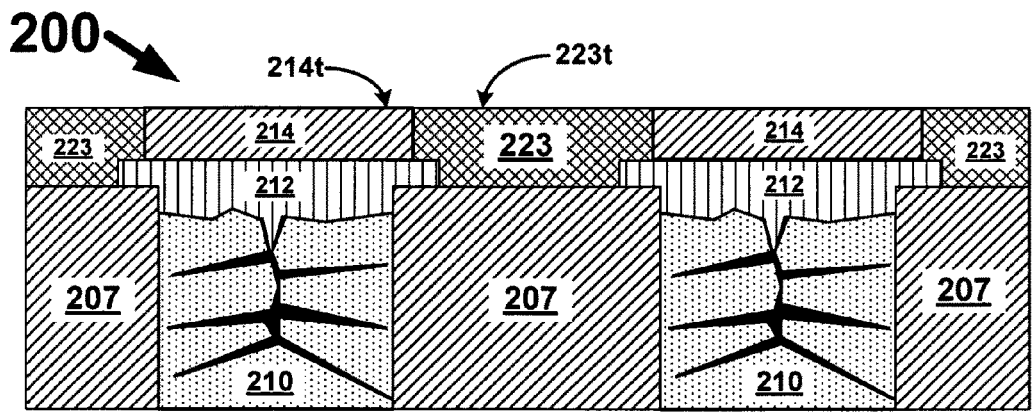
FIG. 2M depicts a cross-sectional view of a second planarization of some of the thin film layers in FIG. 2L to expose an upper surface of an electrode.

In FIG. 2L, the layers 223 and 216 have been planarized to form planar upper surfaces 216t and 223t and those layers will be subsequently planarized down the layer 214 using CMP as depicted by dashed line 222p. In FIG. 2M, after the planarization, the planar upper surfaces 214t of electrodes 214 are exposed and subsequent layers of thin film materials for a memory cells can be deposited over the electrodes 214.

Figure 2N:
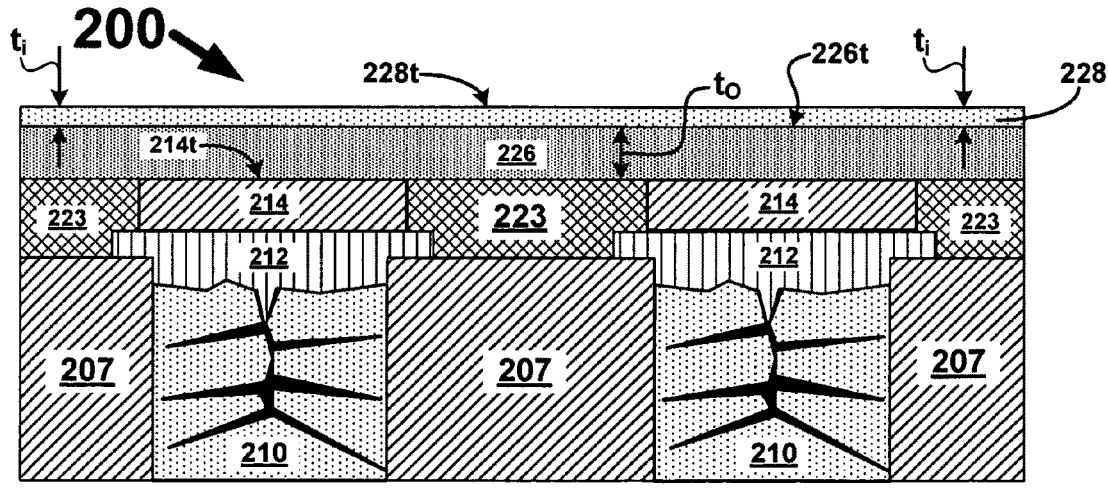
FIGS. 2N through 2O depict a cross-sectional views of a planar layer(s) of a conductive oxide material deposited on an upper surface of an electrode and a planar layer of an electronically insulating material deposited on an uppermost layer the conductive oxide material.
Figure 2O:
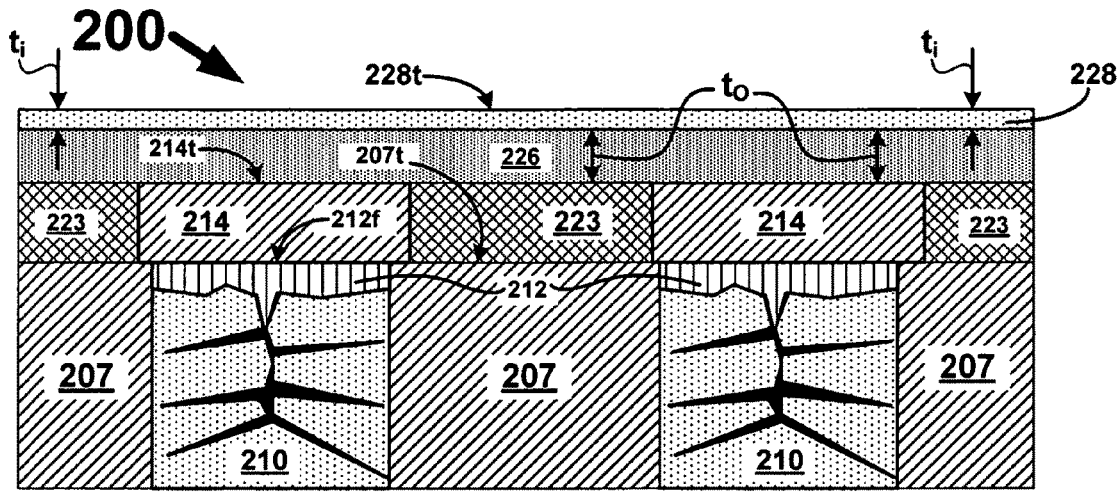

In FIG. 2N, at least one layer of a conductive oxide material 226 is deposited over the planar surfaces of electrodes 214 and layer 223 to form a planar layer 226 having a uniform thickness $t_O$, followed by a deposition of a layer 228 of an electronically insulating material on the planar surface of layer 226 on the layer 228 and having a uniform thickness $t_i$. Both the layers 226 and 228 are substantially planar layers as deposited and their planar upper surfaces are achieved without applying CMP. Although only one layer of the conductive oxide material 226 is depicted, if two or more layers of the conductive oxide material are deposited, then the layer 228 is deposited on the planar surface of the uppermost layer of the conductive oxide layers. Layer thicknesses will be application dependent; however, a typical thickness $t_i$ for the layer 228 is approximately 50 Å or less and the layer 226 can have a thickness $t_O$ in a range from about 100 Å to about 350 Å. FIG. 2O is almost identical to FIG. 2N except the planar surface 212f of layer 212 is flush with the planar surface 207t (see FIG. 2G). Examples of conductive oxides can include materials known in the microelectronics art including but not limited to $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), or $LaSrFeO_x$ (LSFeO), and the like. In some examples, as shown, layer 310 may be PCMO (e.g., a perovskite material such as praseodymium calcium manganese oxide or, for example, $PrCaMnO_x$, where x is nominally 3 for perovskites). The conductive oxide material can be a conductive binary oxide structure such as a metal oxide having the form $A_xO_y$, where A represents a metal and O represents oxygen. The conductive binary oxide structure can be doped to obtain the desired conductive properties for a conductive oxide. For example, depending on the material selected for the conductive oxide material, elements including but not limited to niobium (Nb), fluorine (F), and nitrogen (N) can be used as dopants to alter the conductivity of the layer(s) of conductive oxide material.

Figure 2P:
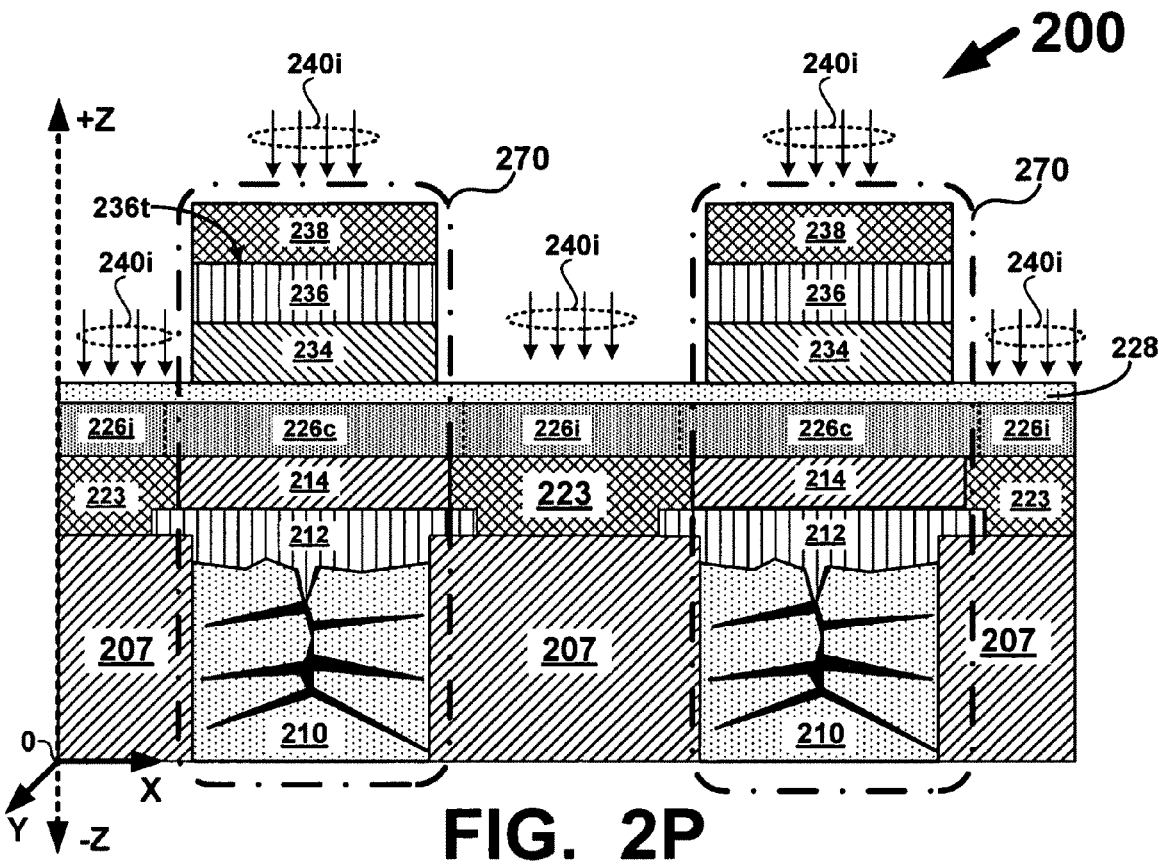
FIG. 2P depicts a cross-sectional view of one or more layers of a conductive oxide material being ion implanted to form regions of an insulating oxide material.

Reference is now made to FIG. 2P where additional layers of thin film materials have been deposited on the layer 228, patterned, and then etched to form a stack of layers 234, 236, and 238. Here, the layers 234, 236, and 238 can form a top electrode structure with the layers 210, 212, and 214 forming a bottom electrode structure. Layer 234 can be a material such as platinum (Pt), layer 236 can be a layer of an adhesion material such as titanium nitride (TiN), and layer 238 can be a material such as tungsten (W), for example. Layers 214 and 234 can both be made from a material specifically selected for its compatibility with the layers 226 and 228. For example, platinum (Pt) can be selected for the layer 214 because the crystalline structure of Pt provides a favorable template for replication of the crystalline structure in the layer 226. As another example, platinum (Pt) can be selected for the layer 234 because it is a chemically stable material for mating with the layer 228 (e.g. rare earth oxides, rare earth metal oxides, yttria stabilized zirconia (YSZ), yttrium oxide ($Y_2O_3$), zirconium oxide (ZrOx), also referred to as zirconia (e.g., $ZrO_2$), hafnium oxide ($HfO_x$), gadolinium oxide ($GdO_x$), lanthanum aluminum oxide ($LaAlO_x$), erbium oxide ($ErO_x$) (e.g., $Er_2O_3$), and the like, or some other electronically insulating material).

The structure enclosed in the dashed lines in FIG. 2P forms a memory cell 270. Each memory cell 270 is electrically isolated from an adjacent memory cell 270 by ion implantation 240i. Portions of layers 228 and 226 that are covered by the layers 234, 236, and 238 are masked off or shielded from the implant 240i by those layers such that portions 226c remain electrically conductive, conductive oxides, and portions 226i are un-shielded and bombarded by the implant 240i and are transformed by the implant into insulating oxides operative to electrically isolate adjacent memory cells 270 from one another. The isolation of the adjacent memory cells 270 is accomplished without having to etch portions of the layer 226 and 228 that are outside the encircled areas 270 such that the layers 226 and 228 are planar, continuous, and un-etched. Each memory cell 270 can be one of many two-terminal memory cells in a two-terminal cross point memory array (not shown).

Figure 3A:
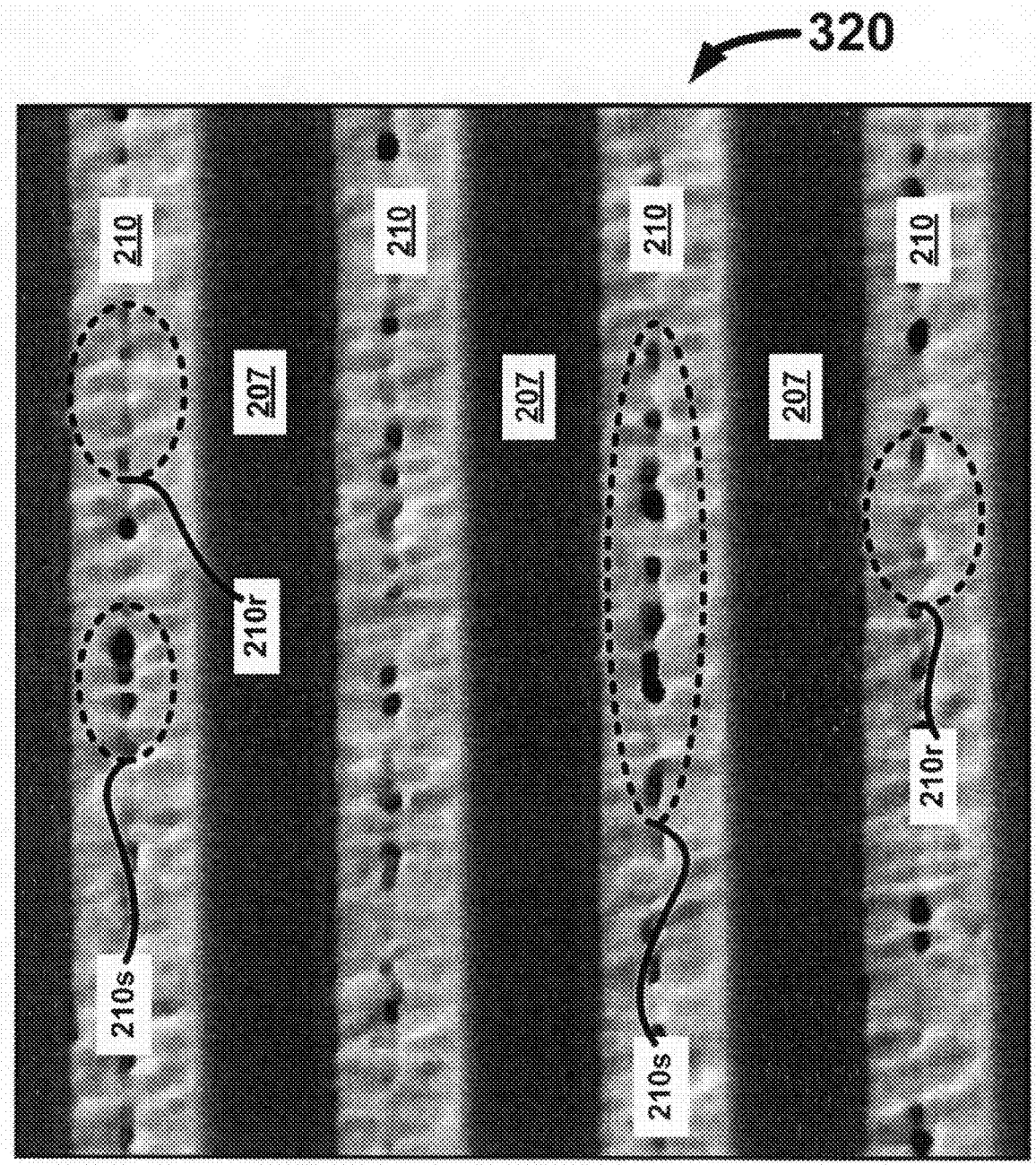
FIG. 3A depicts a top down SEM image of the structure depicted in FIG. 2C.
Figure 3B:
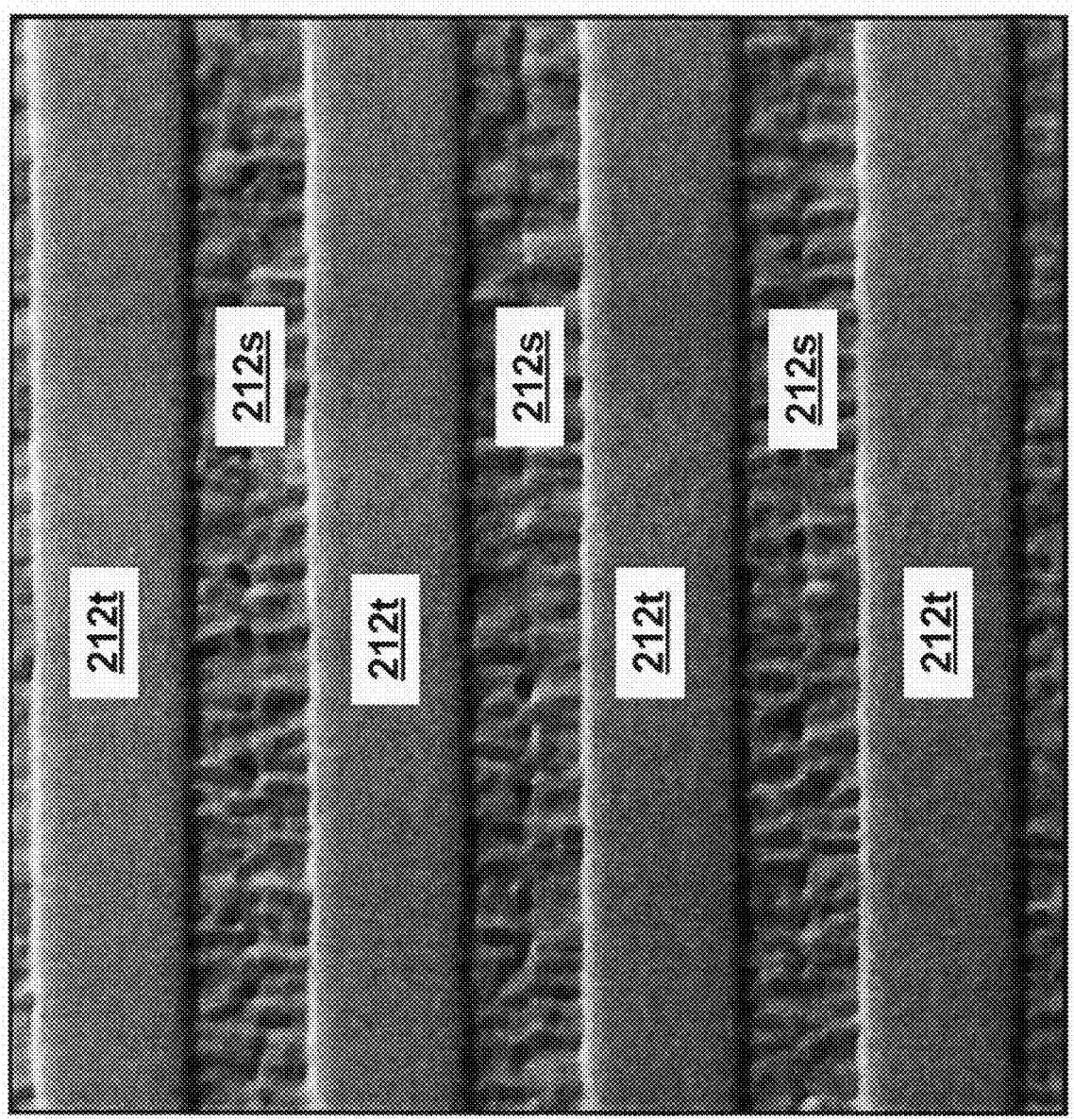
FIG. 3B depicts a top down SEM image of the structure depicted in FIG. 2D.
Figure 3C:
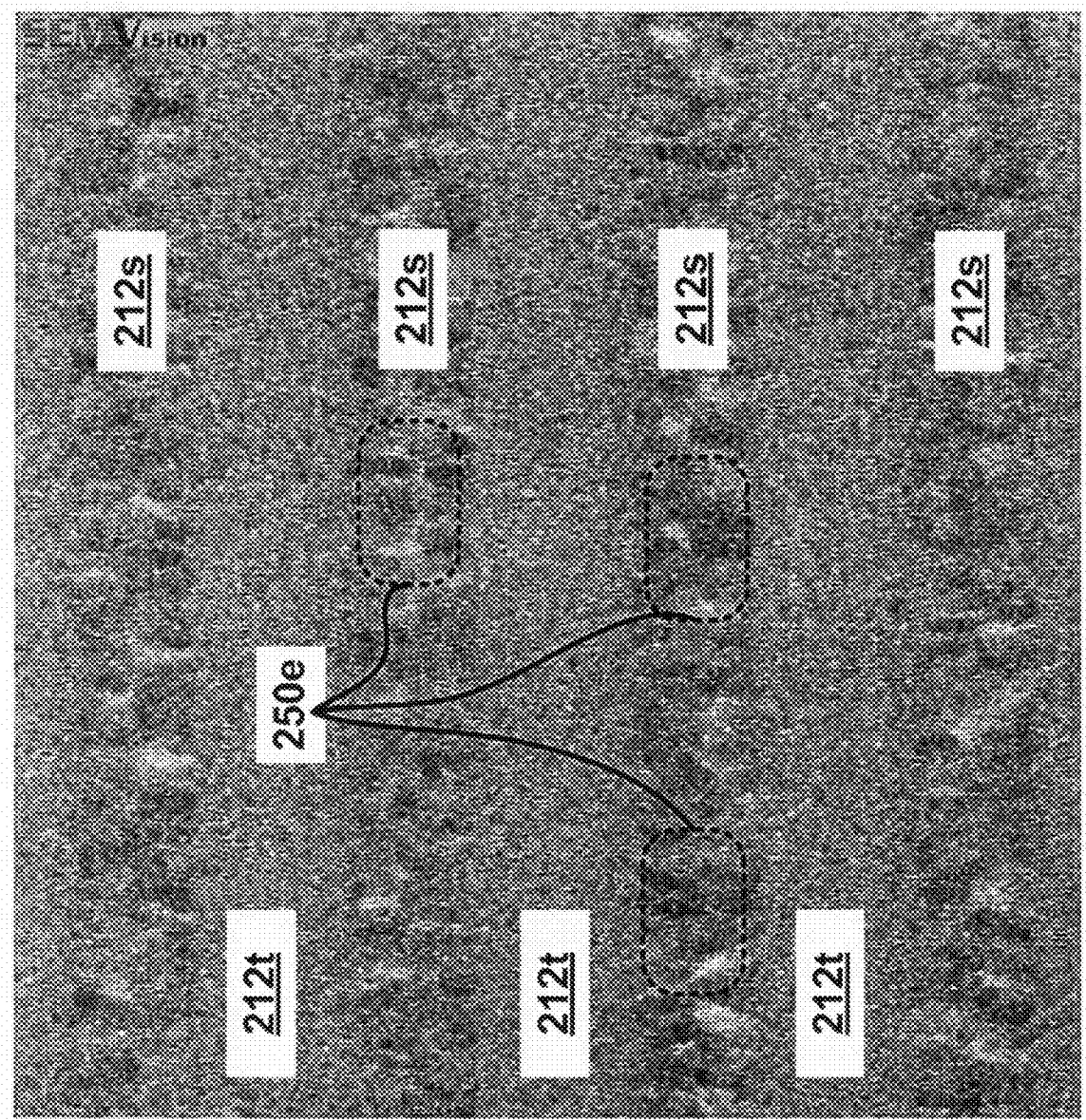
FIG. 3C depicts a top down SEM image of the structure depicted in FIG. 2E after a CMP process has planarized the deposited material in FIG. 2D.

Turning now to FIG. 3A, a top down SEM image 320 of the structure depicted in FIG. 2C depicts the seams 210s and the surface roughness 210r of recessed tungsten trench conductors 210 and adjacent oxide areas 207. In FIG. 3B, a top down SEM image 330 of the structure depicted in FIG. 2E depicts the structure 320 of FIG. 2C after a TN adhesion overburden layer 212 has been deposited to the depth $t_2$. Regions 212s are the step reduction regions of the layer 212 that are positioned below upper surface 212t. FIG. 3C is a top down SEM image 340 of the structure depicted in FIG. 2E after CMP has begun but prior to CMP being completed as depicted in FIG. 2F. Here, portions 212t are depicted as smooth and planar and step reduction portions 250a-d (collectively denoted as dashed region 250e) are not similarly planar and smooth as the surface 212t because the surfactant in the polishing slurry prevents abrasive action on the low portions 250 while allowing abrasive action on the high portions (e.g., 212t). Although not depicted in FIG. 3C, as the CMP process continues, the high portions would progressively be polished down to the low portions until no more low portions exist and the resulting surface is planar as depicted in FIGS. 2F and 2G.

Figure 3D:
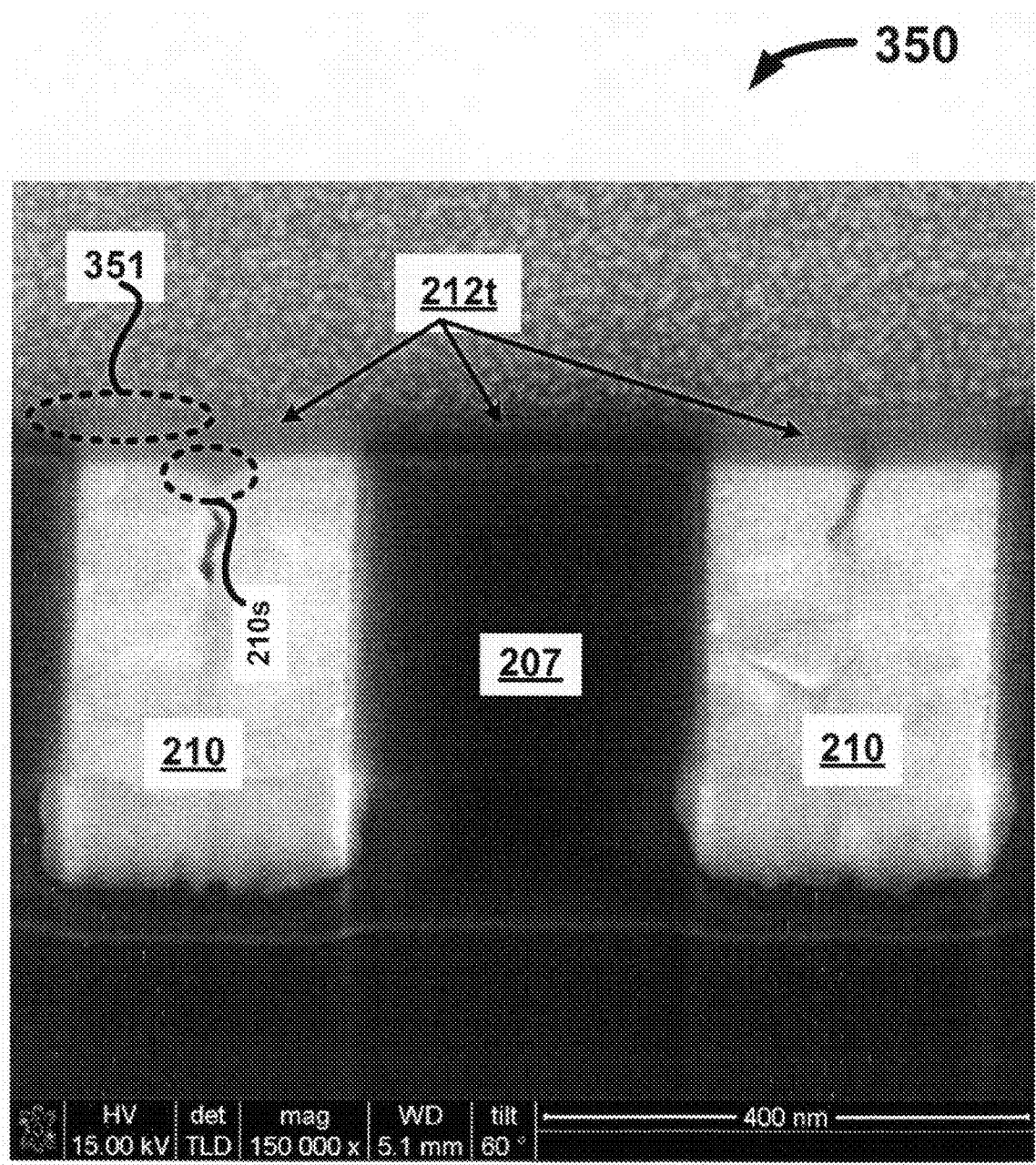
FIG. 3D depicts a focused ion beam image of a cross-section of a planar layer of an adhesion material depicted in FIG. 2F.

In FIG. 3D, a focused ion beam image of a cross-section of a planar layer of the adhesion material depicted in FIG. 2H shows a planar adhesion layer 212t and that the seams 210s have been at least partially filled in by the adhesion material 212. Additional layers 351 formed above planar layer 212p are also planar and smooth.

Figure 1K:
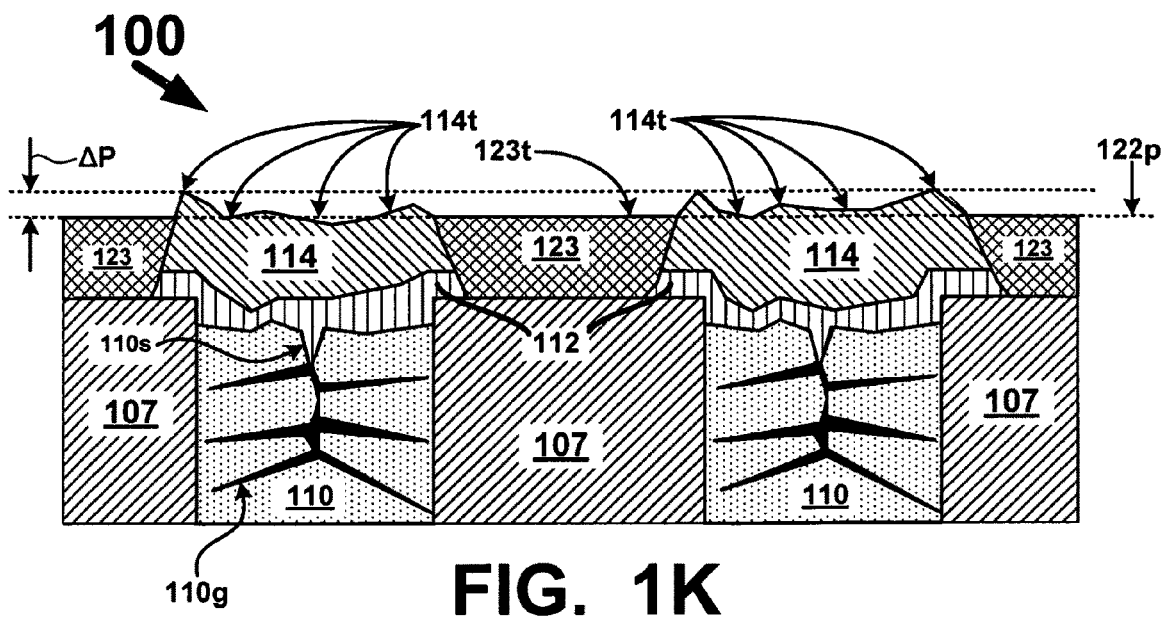
FIG. 1K depicts a cross-sectional view of the structure of FIG. 1J after another CMP process.
Figure 3E:
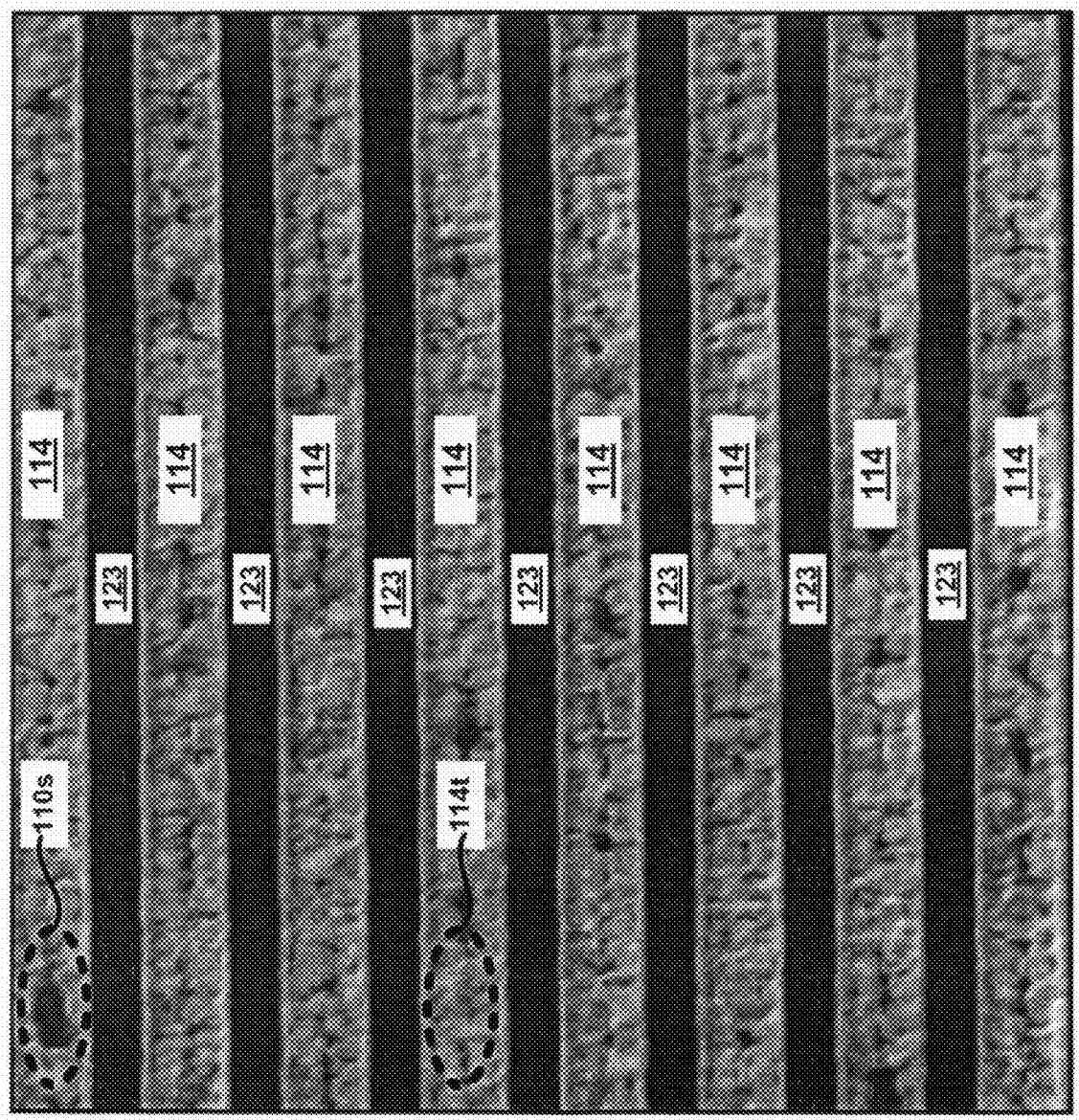
FIG. 3E depicts a top down SEM image of the conventional structure having surface roughness and voids in the bottom electrode as depicted in FIG. 1K.
Figure 3F:
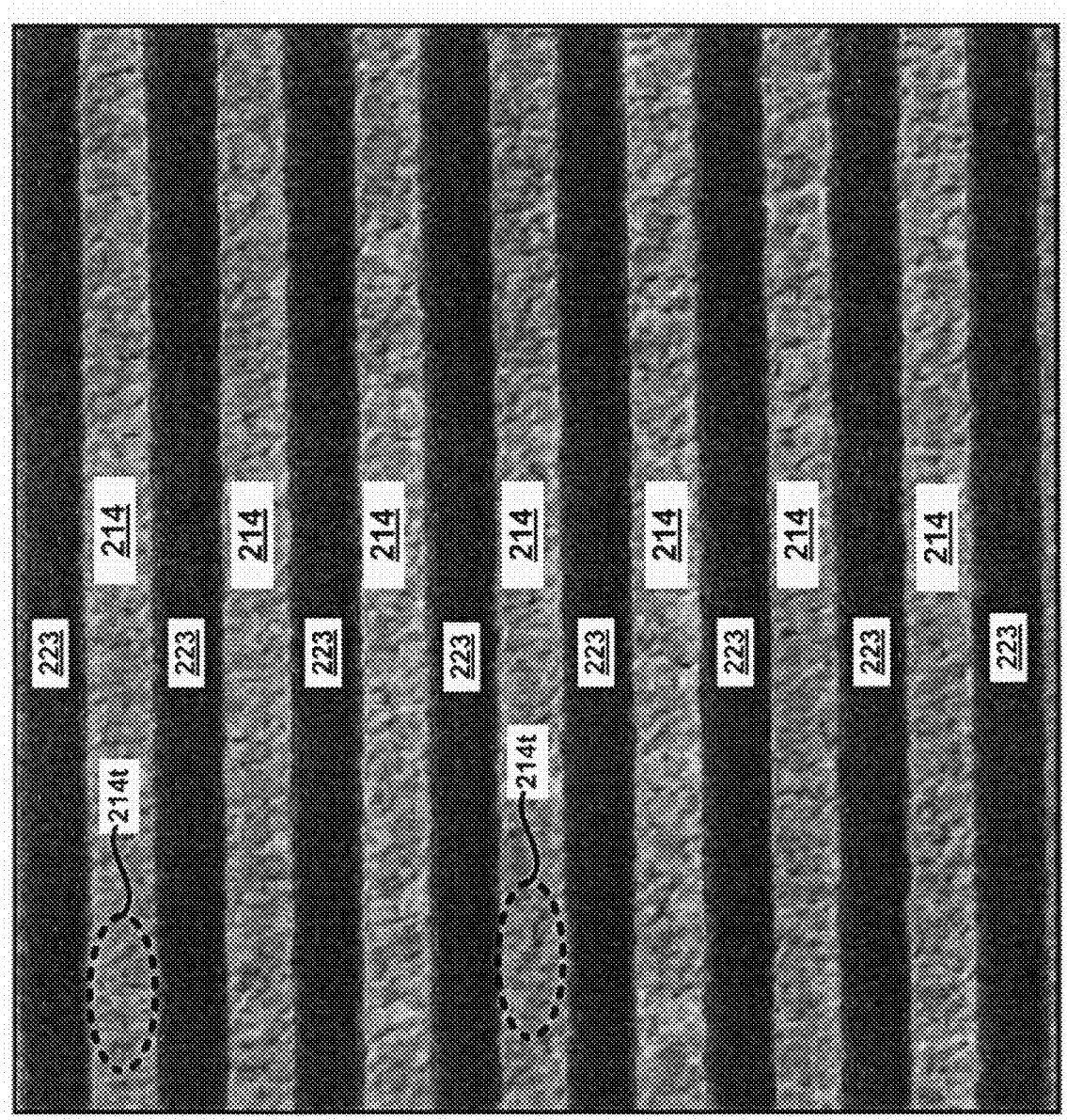
FIG. 3F depicts a top down SEM image of the structure having a planar bottom electrode as depicted in FIG. 2M.

FIGS. 3E and 3F are top down SEM images 360 and 370 that clearly depict differences in surface structure for the conventional electrodes 114 depicted in FIGS. 3E and 1K and the electrodes 214 depicted in FIGS. 3F and 2M. The non-planar and rough surface of underlying layer 112 in FIG. 1K results in a non-planar and rough surface on electrode 114. In sharp contrast, upper surface 214t of electrode 214 in FIGS. 3F and 2M is planar and smooth because it was deposited on and planar and smooth layer 212.

Figure 1L:
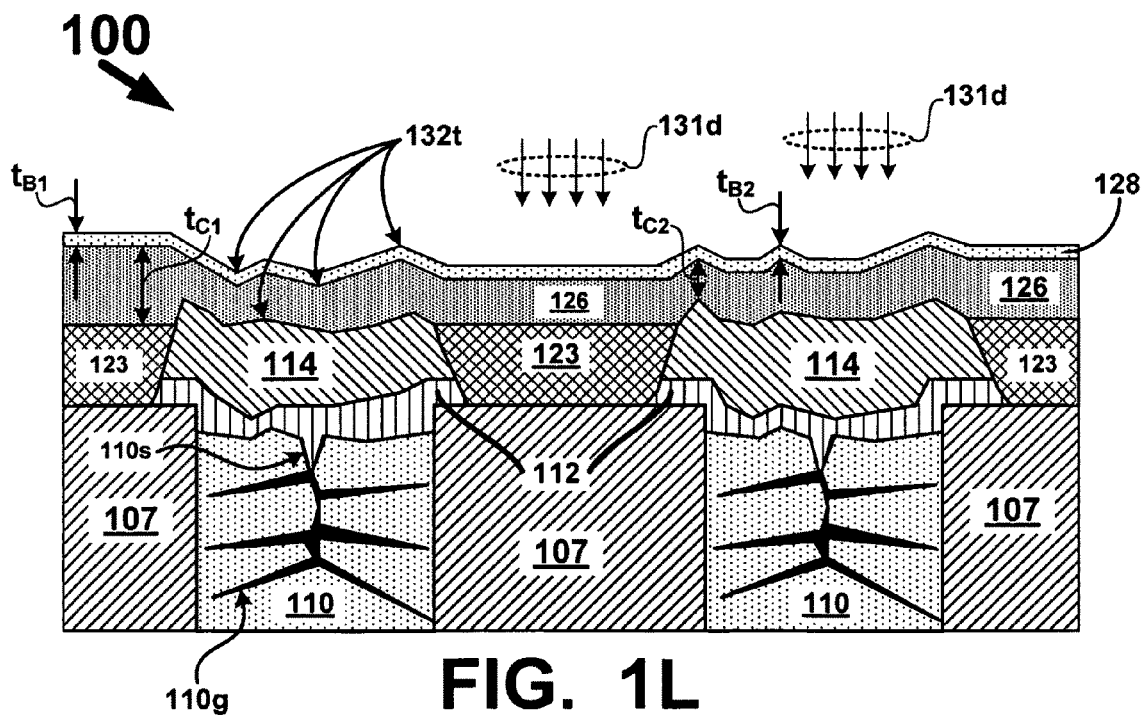
FIG. 1L depicts the structure of FIG. 1K after a deposition of thin film layers of a memory material.
Figure 1M:
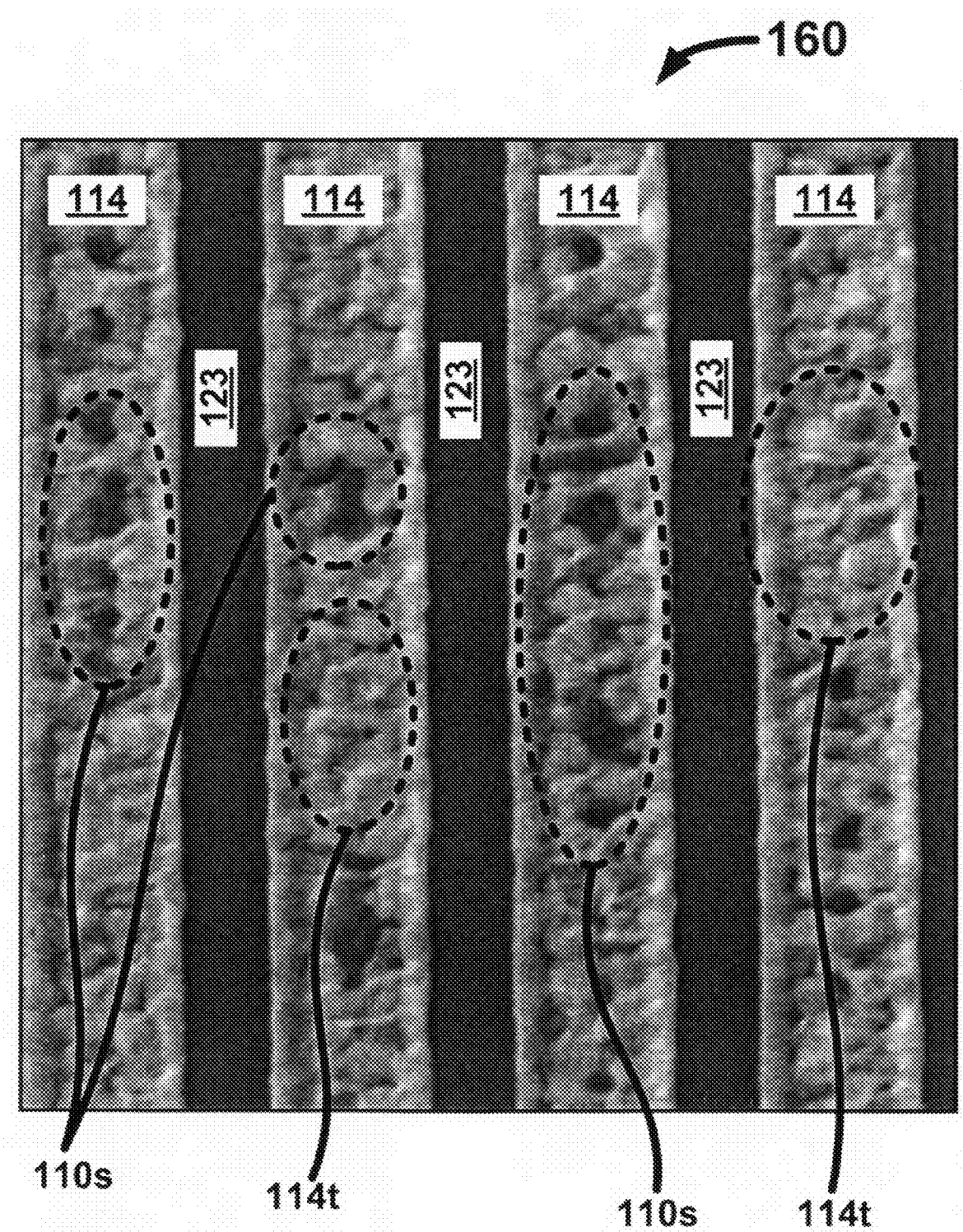
FIG. 1M depicts a top down SEM image of the structure depicted in FIG. 1K.
Figure 1N:
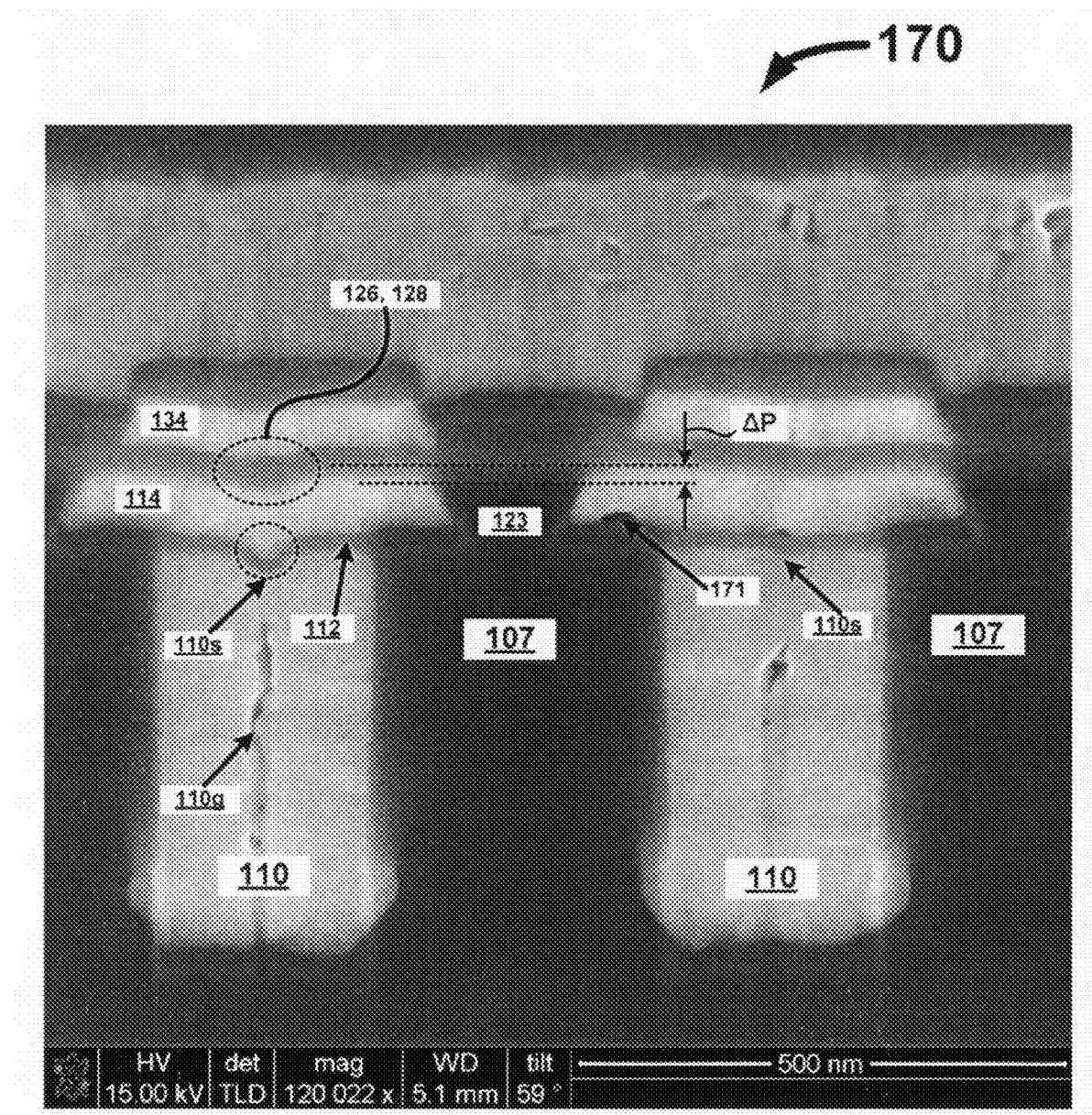
FIG. 1N depicts a focused ion beam image of a cross-section of memory cells in a cross-point memory array and having surface roughness in the layers of memory material depicted in FIG. 1L.
Figure 10:
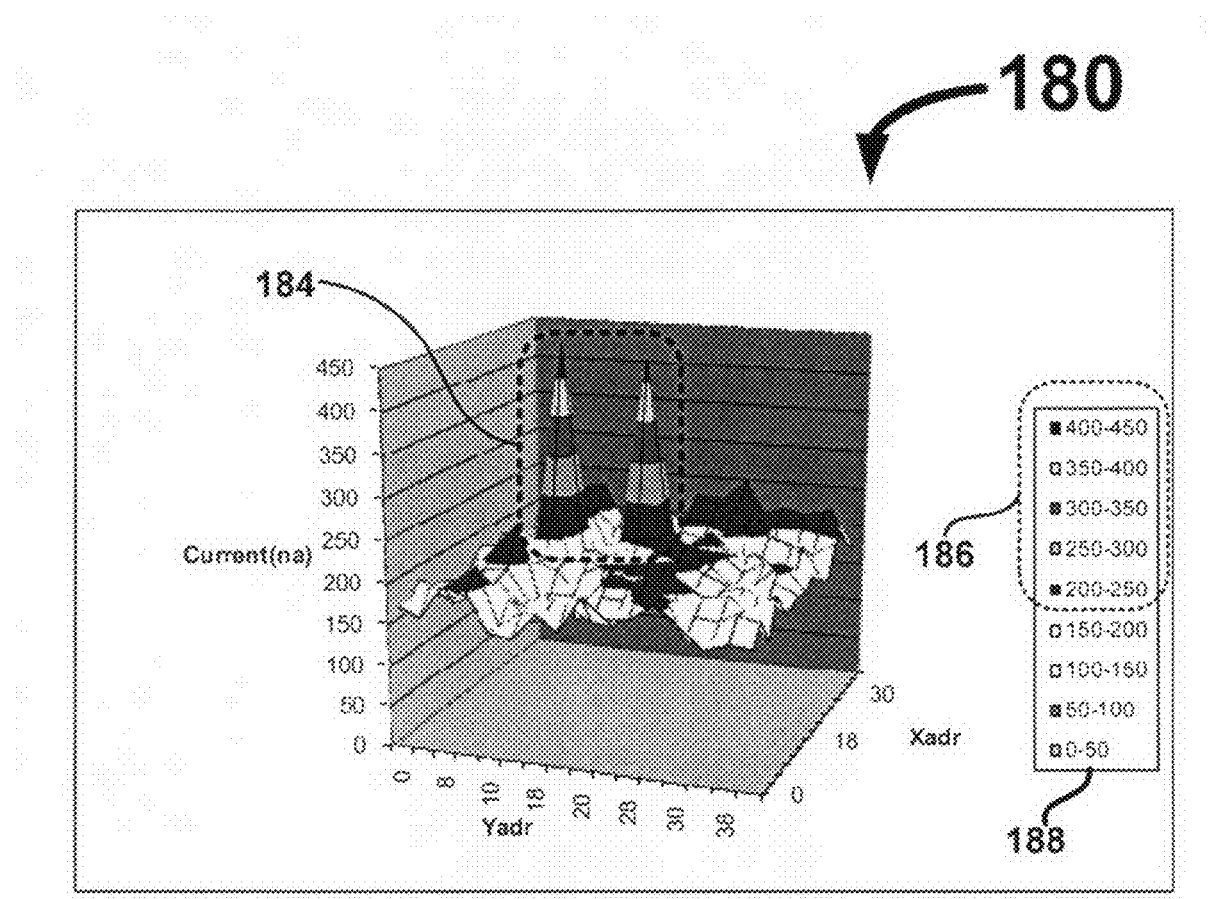
Figure 3G:
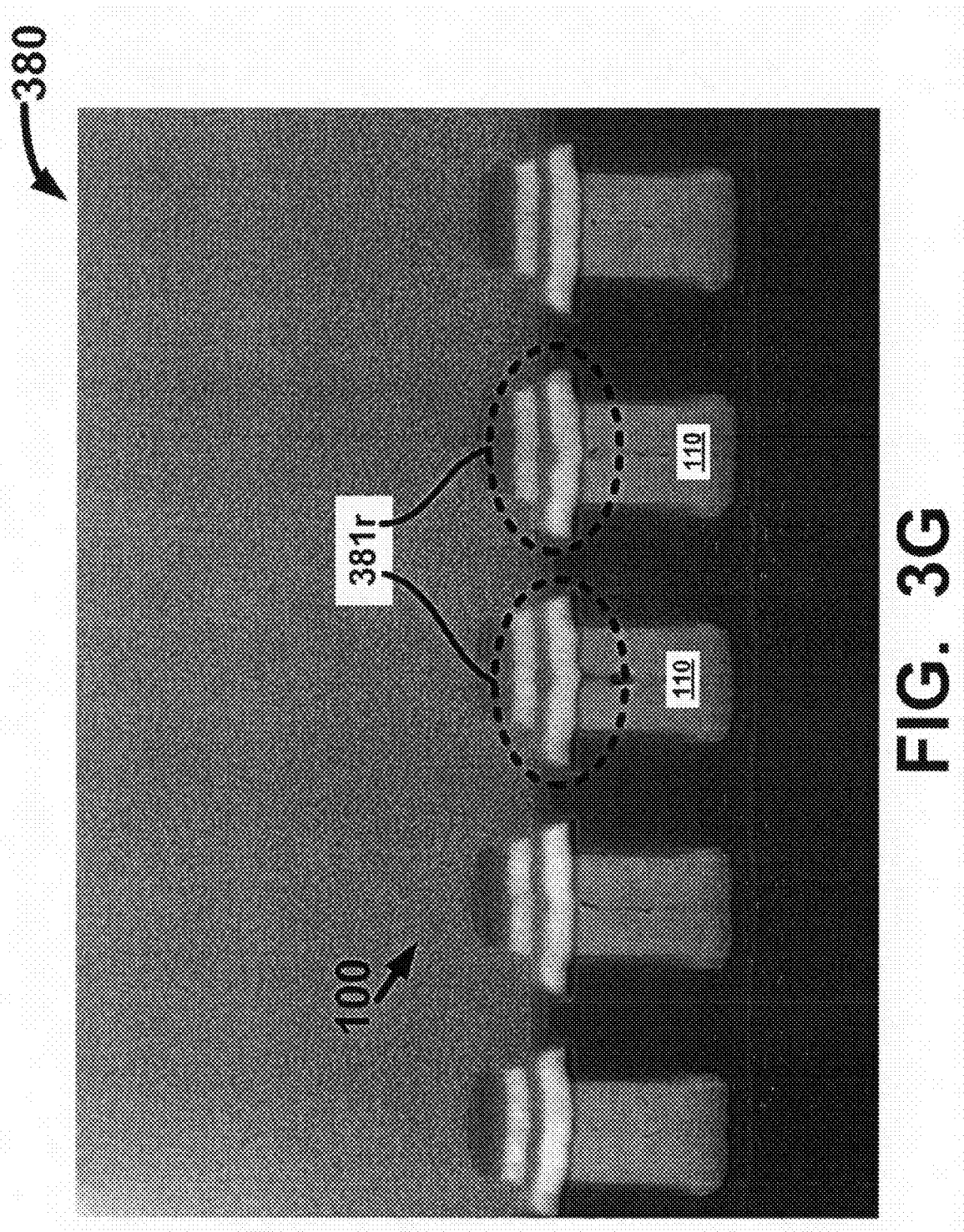
FIGS. 3G and 3H depict focused ion beam images of a cross-section of conventional memory cells in a cross-point array including non-planar bottom electrodes and non-planar thin film layers of memory material depicted in FIGS. 1L and 1N.
Figure 3H:
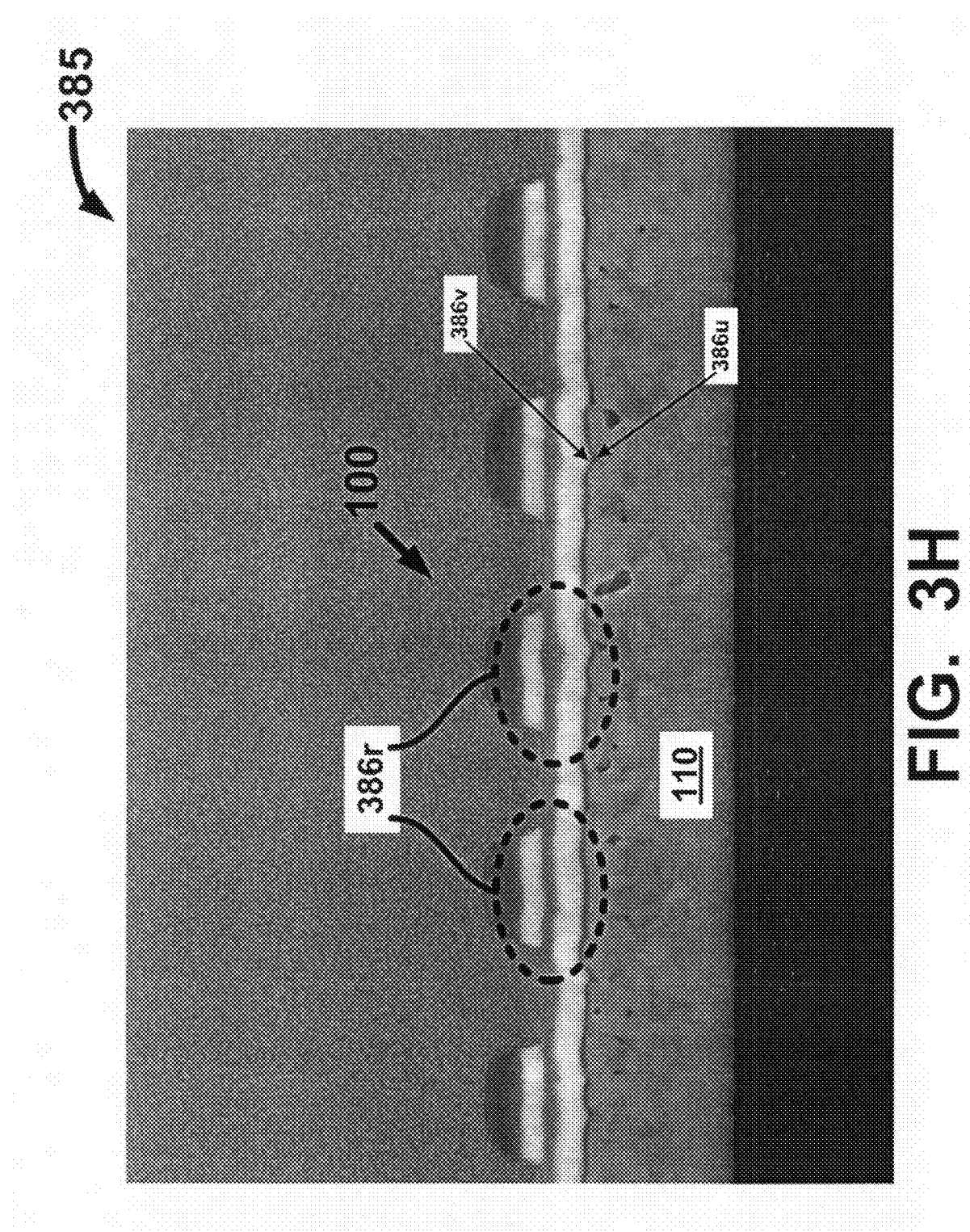

FIGS. 3G and 3H depict focused ion beam images (380, 385) of cross-sections of conventional memory cells in a cross-point array that including non-planar bottom electrodes and non-planar thin film layers of memory material depicted in FIGS. 1L and 1N as described above. Here, encircled regions 381r and 386r show how the non-planar and rough upper surface (386u, 386v) of trench conductor 110 is replicated in subsequently deposited layers such that the conductive oxide layer and electronically insulating layer are not planar and smooth.

Figure 3I:
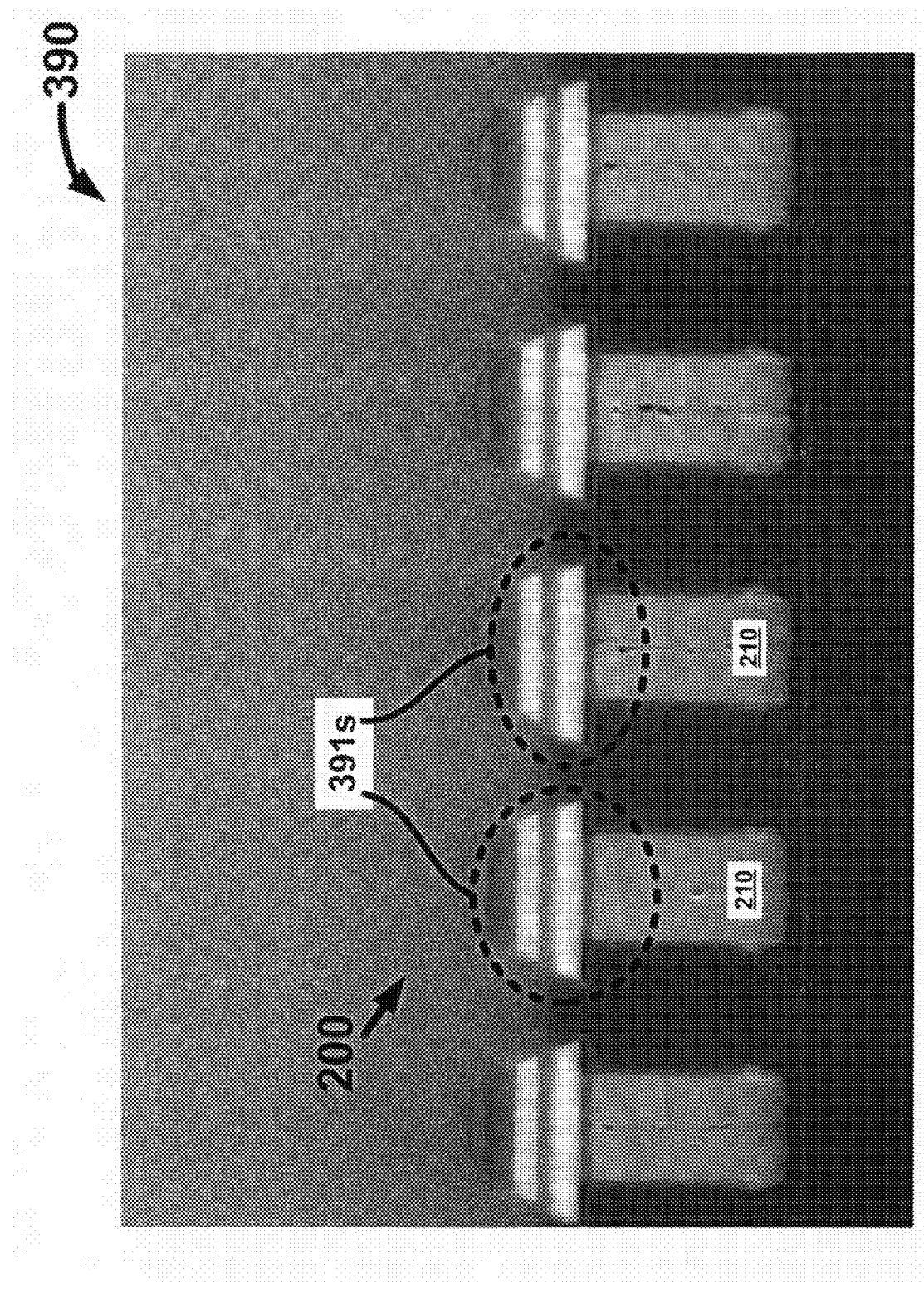
FIGS. 3I and 3J depict focused ion beam images of a cross-section of memory cells in a cross-point array including planar bottom electrodes and planar thin film layers of memory material as depicted in FIG. 2P.
Figure 3J:
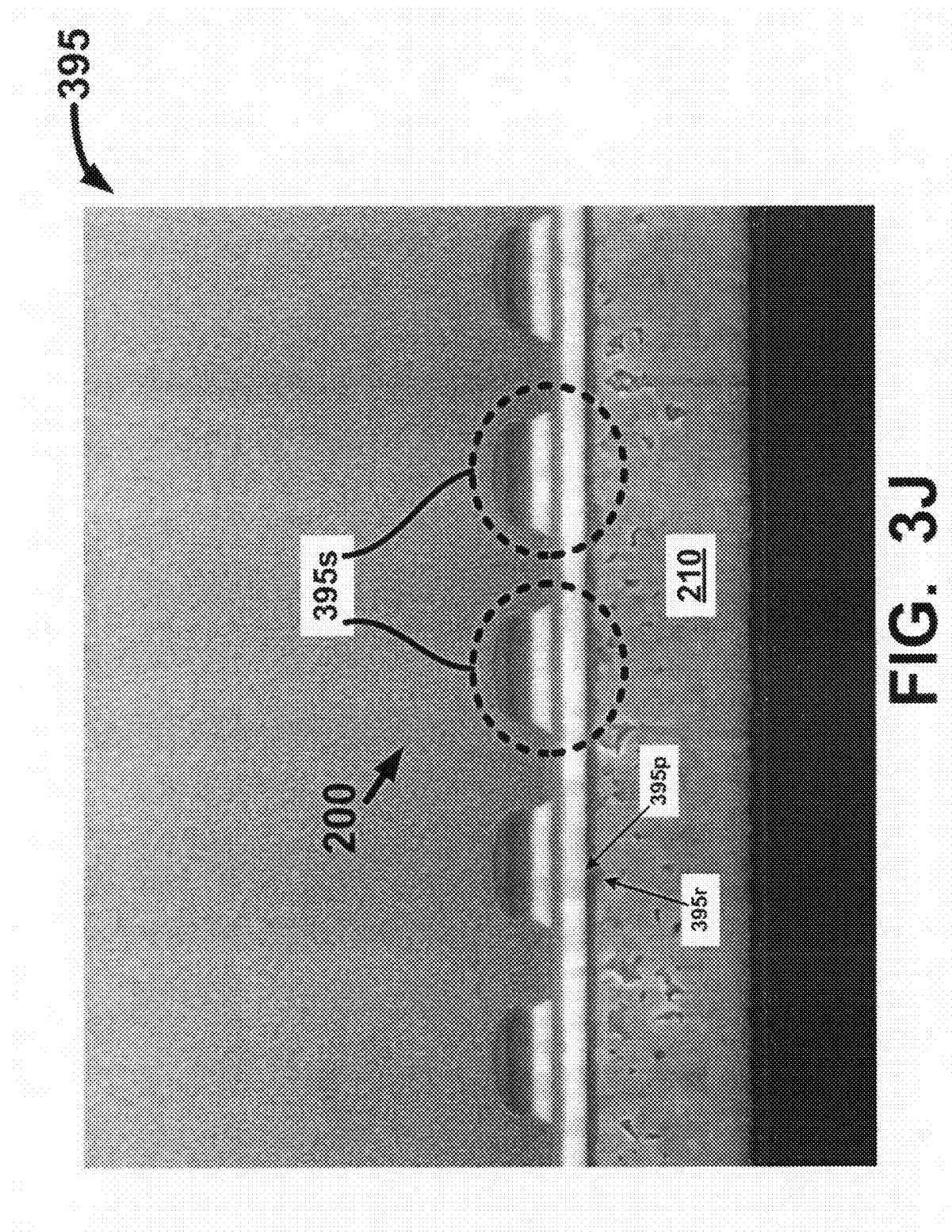

FIGS. 3I and 3J depict focused ion beam images (390, 395) of cross-sections of memory cells in a cross-point array including planar bottom electrodes and planar thin film layers of memory material as depicted in FIG. 2P as described above. Here, encircled regions 391s and 395s depict planar and smooth layers of thin film material formed above trench conductor 210. In the image of FIG. 3J, region 395r of trench conductor 210 is rough; however, region 395p of the TiN adhesion layer is planar and smooth as are the thin film layers deposited above it.

FIGS. 3K and 3L depict focused ion beam images of conventional memory cells 396 and memory cells of the present invention 397 respectively. For the conventional memory cells of FIG. 3K, failure to remedy the effects of the non-planar adhesion layer results in surface roughness and non-planar surfaces in subsequently deposited thin film layers as depicted in encircled region 396s and in non-planar electrode layers 134 and 114 and the layers between 114 and 134. In contrast, image 397 of FIG. 3L depicts an encircled region 397s in which electrode layers 214 and 300t are planar and smooth due to a planar and smooth adhesion layer upon which layer 214 was deposited.

Figure 3M:
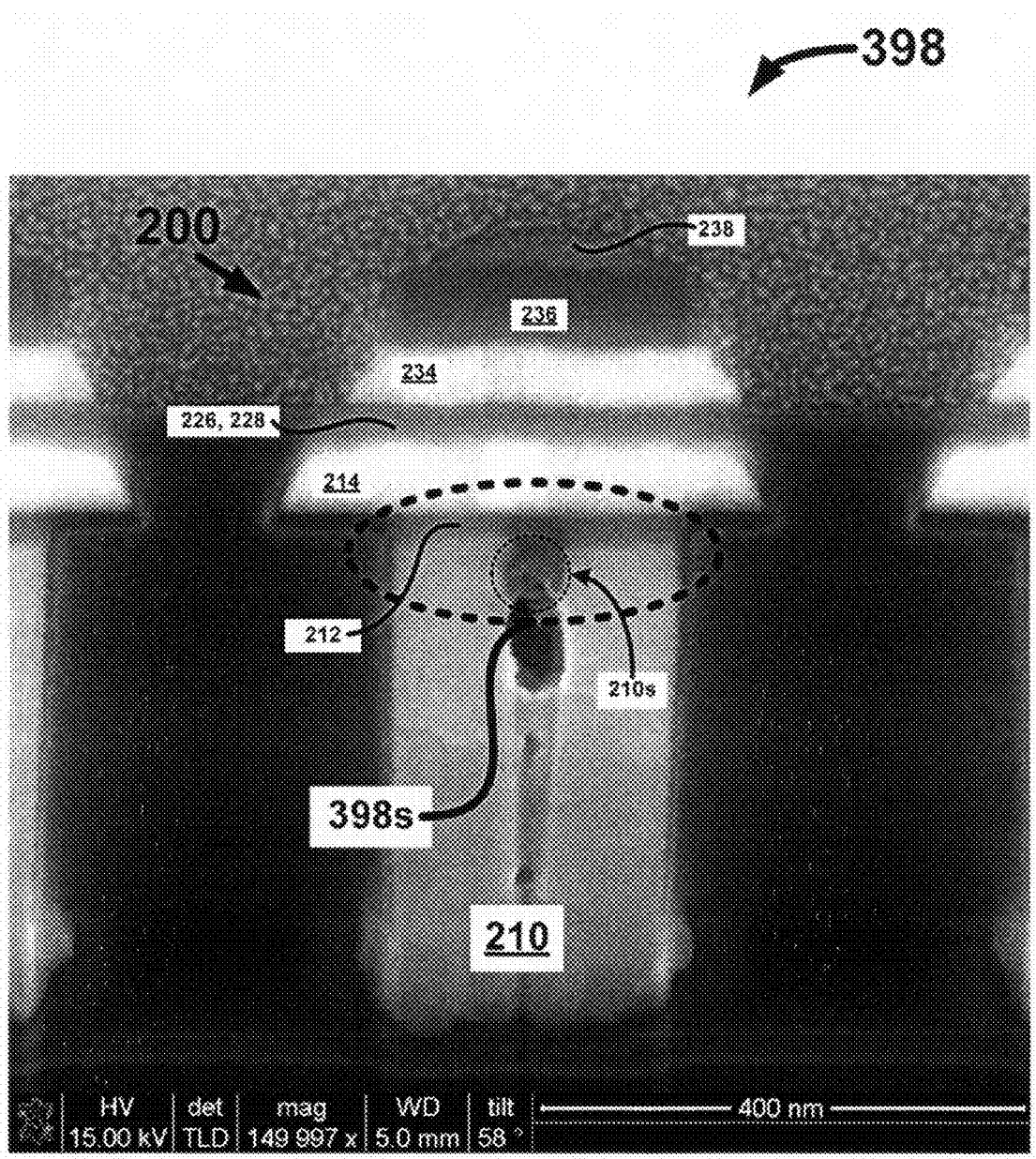
FIG. 3M depicts an enlarged focused ion beam image of a cross-section of a memory cell including planar layers of thin film materials.

FIG. 3M depicts an enlarged focused ion beam image 398 of a cross-section of a memory cell. Here, encircled region 398s clearly shows seam 210s partially filled in by material from adhesion layer 212 and that the upper surface of layer 212 is planar. The electrode 214 is also planar as are the layers 226 and 228 of the memory cell.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A method for forming a planar surface, comprising:
   providing a dielectric layer including a first planar surface having an opening formed therein and an electrically conductive structure positioned in the opening, the electrically conductive structure including a first non-planar surface disposed below the first planar surface by a first distance;
   depositing an adhesion layer on the first planar surface to a first thickness that is approximately two times the first distance or more, the adhesion layer completely filling the opening and conformally covering the first planar surface and the first non-planar surface, the adhesion layer is non-planar and includes a dished region positioned approximately above the opening and recessed by a second distance;

chemically and mechanically polishing (CMP) the adhesion layer to form a planar adhesion layer by
applying a polishing composition including a surfactant to the adhesion layer, and
movably applying a polishing pad over the polishing composition-covered surface of the adhesion layer to planarize the adhesion layer, the surfactant operative to allow the polishing composition to preferentially polish high portions of the dished region while preventing polishing of low portions of the dished region; and
halting the polishing when the dished region is removed and the adhesion layer is planar.

2. The method of claim 1, wherein the polishing composition comprises an aqueous solution including ceria.

3. The method of claim 2, wherein the polishing composition is manufactured to include the surfactant.

4. The method of claim 2 and further comprising: adding the surfactant to the polishing composition.

5. The method of claim 1 and further comprising: determining the first distance prior to the depositing of the adhesion layer.

6. The method of claim 1 and further comprising: determining the second distance prior to the planarizing of the adhesion layer.

7. The method of claim 1, wherein the electrically conductive structure comprises tungsten.

8. The method of claim 1, wherein the electrically conductive structure comprises copper.

9. The method of claim 1, wherein the opening comprises a trench formed in the dielectric layer.

10. The method of claim 1, wherein the opening comprises a via formed in the dielectric layer.

11. The method of claim 1, wherein the adhesion layer comprises titanium nitride.

12. The method of claim 1, wherein the adhesion layer comprises tantalum nitride.

13. The method of claim 1, wherein the first thickness is in a range from about 100 Å to about 500 Å.

14. The method of claim 1, wherein the first distance and the second distance are approximately equal to each other.

15. The method of claim 1, wherein the halting comprises the adhesion layer being planarized at least below the second distance of the dished portion to form the planar adhesion layer.

16. The method of claim 1, wherein the halting comprises stopping the polishing after a predetermined time has elapsed.

17. The method of claim 1 and further comprising: removing the polishing composition.

18. The method of claim 1 and further comprising: depositing a layer of an electrically conductive material on the planar adhesion layer, the layer of the electrically conductive material is planar as deposited without applying CMP.

19. The method of claim 18, wherein the electrically conductive material comprises a metal or a metal alloy.

20. The method of claim 19, wherein the electrically conductive material comprises platinum.

21. The method of claim 18 and further comprising: depositing at least one layer of a conductive oxide material on the layer of the electrically conductive material, the at least one layer of a conductive oxide material is planar as deposited without applying CMP.

22. The method of claim 21, wherein the conductive oxide material comprises a conductive metal oxide.

23. The method of claim 22, wherein the conductive oxide comprises a perovskite.

24. The method of claim 22, wherein the conductive oxide comprises a binary oxide.

25. The method of claim 21 and further comprising: depositing a layer of an electronically insulating material on an uppermost layer of the at least one layer of a conductive oxide material, the electronically insulating material is planar as deposited without applying CMP.

26. The method of claim 25, wherein the electronically insulating material has a thickness that is approximately 50 Å or less.

27. The method of claim 26, wherein the electronically insulating material comprises yttria-stabilized zirconia (YSZ).

28. The method of claim 1, wherein a polishing pressure of the polishing pad is in a range from about 2 psi to about 5 psi.

29. The method of claim 1, wherein the polishing compound comprises EKC 2100 RA3 and the surfactant is included in the polishing compound.

30. The method of claim 1, wherein the opening in the dielectric layer includes a liner material in contact with surfaces of the opening and with the electrically conductive structure.

* * * * *